(12) United States Patent
White et al.

(10) Patent No.: US 12,306,219 B2
(45) Date of Patent: May 20, 2025

(54) SIGNAL MEASURING APPARATUS

(71) Applicant: Pragmatic Semiconductor Limited, Sedgefield (GB)

(72) Inventors: Scott White, Sedgefield (GB); Richard Price, Sedgefield (GB); Feras Alkhalil, Sedgefield (GB); Catherine Ramsdale, Sedgefield (GB); Antony Sou, Sedgefield (GB)

(73) Assignee: Pragmatic Semiconductor Limited, Cambridge (GB)

( * ) Notice: Subject to any disclaimer, the term of this patent is extended or adjusted under 35 U.S.C. 154(b) by 171 days.

(21) Appl. No.: 18/014,516

(22) PCT Filed: Jul. 6, 2021

(86) PCT No.: PCT/GB2021/051723
§ 371 (c)(1),
(2) Date: Jan. 5, 2023

(87) PCT Pub. No.: WO2022/008904
PCT Pub. Date: Jan. 13, 2022

(65) Prior Publication Data
US 2023/0258695 A1  Aug. 17, 2023

(30) Foreign Application Priority Data

Jul. 6, 2020 (GB) ..................................... 2010360

(51) Int. Cl.
| | | |
|---|---|---|
| *G01R 19/165* | (2006.01) | |
| *G01D 9/00* | (2006.01) | |
| *G01D 21/00* | (2006.01) | |
| *G01R 19/00* | (2006.01) | |
| *H10B 63/10* | (2023.01) | |

(52) U.S. Cl.
CPC ......... *G01R 19/16566* (2013.01); *G01D 9/00* (2013.01); *G01D 21/00* (2013.01); *G01R 19/00* (2013.01); *H10B 63/10* (2023.02)

(58) Field of Classification Search
CPC .. G01R 19/16566; G01R 19/00; H10B 63/10; G01D 21/00; G01D 9/00; G11C 13/0004;
(Continued)

(56) References Cited

U.S. PATENT DOCUMENTS

| | | | |
|---|---|---|---|
| 6,617,963 B1 | 9/2003 | Watters et al. | |
| 2006/0244433 A1* | 11/2006 | Nakahara | G01R 31/30 |
| | | | 324/76.11 |

(Continued)

FOREIGN PATENT DOCUMENTS

| | | |
|---|---|---|
| CN | 102544050 | 7/2012 |
| EP | 3153850 | 4/2017 |
| EP | 3154148 | 4/2017 |

OTHER PUBLICATIONS

International Search Report and the Written Opinion Dated Oct. 18, 2021 From the International Searching Authority Re. Application No. PCT/GB2021/051723. (13 Pages).

(Continued)

*Primary Examiner* — Raul J Rios Russo

(57) ABSTRACT

A signal measuring apparatus comprising: signal circuitry configured to receive an input signal to be measured; and memory circuitry coupled to the signal circuitry and configured to store information representing a magnitude of a voltage or a current of the input signal; wherein the memory circuitry comprises a first memory cell having a material which is arranged to switch from a first material state to a second material state in response to a first switching signal being applied thereto, wherein the first memory cell is tuned to a first value for the first switching signal so that a current or voltage with a magnitude at or above the first value will cause the material of the first memory cell to switch from the first material state to second material state; wherein the apparatus is configured to apply a measurement signal indicative of the input signal to the first memory cell for
(Continued)

switching the material of the first memory cell from the first material state to the second material state in dependence on a magnitude of the voltage or current of the measurement signal.

20 Claims, 6 Drawing Sheets

(58) Field of Classification Search
CPC .............. G11C 11/5678; G11C 13/004; G11C 13/0069; G01K 11/00; H10N 70/231; H10N 70/8265; H10N 70/828
USPC ...................................................... 324/140 R
See application file for complete search history.

(56) References Cited

U.S. PATENT DOCUMENTS

| 2008/0049495 | A1* | 2/2008 | Yamada | ........... | G11C 29/50004 |
| | | | | | 365/185.17 |
| 2012/0013306 | A1 | 1/2012 | Kadirvel | | |
| 2012/0092181 | A1 | 4/2012 | Daniel et al. | | |
| 2013/0094276 | A1* | 4/2013 | Torsi | .................. | G11C 13/0007 |
| | | | | | 365/189.011 |
| 2016/0161533 | A1* | 6/2016 | Simon | ................ | G01R 19/1659 |
| | | | | | 324/103 R |
| 2019/0108881 | A1* | 4/2019 | Spessot | ................ | G11C 13/004 |
| 2022/0122664 | A1* | 4/2022 | Robustelli | .......... | G11C 13/0026 |
| 2023/0258695 | A1 | 8/2023 | White | | |

OTHER PUBLICATIONS

Patents Act 1977: Search Report Under Section 17 Dated Aug. 24, 2020 From the Intellectual Property Office of the United Kingdom of Great Britain Re. Application No. GB2010360.2. (2 Pages).
Patents Act 1977: Examination Report Under Section 18(3) Dated May 28, 2024 From the Intellectual Property Office of the United Kingdom of Great Britain Re. Application No. GB2010360.2. (5 Pages).

\* cited by examiner

SIGNAL MEASURING APPARATUS

RELATED APPLICATIONS

This application is a National Phase of PCT Patent Application No. PCT/GB2021/051723 having International filing date of Jul. 6, 2021, which claims the benefit of priority of United Kingdom Patent Application No. 2010360.2 filed on Jul. 6, 2020. The contents of the above applications are all incorporated by reference as if fully set forth herein in their entirety.

FIELD AND BACKGROUND OF THE INVENTION

Sensors may be provided to measure properties of their environment, such as humidity or temperature sensors. In some cases, these sensors may store data locally for extended periods of time before that data may be transmitted elsewhere. For example, a sensor system may comprise multiple sensors, where each sensor may obtain a measurement at a selected time of day, and then only at the end of the day are these measurements obtained from the sensor. For example, at the end of the day, each sensor may have its data downloaded to a computer for further analysis. Each sensor may therefore store measurement data for extended periods of time before that data is collected by a computer.

The present inventors have identified that it may be advantageous to facilitate the provision of smaller and/or less power hungry sensors.

SUMMARY OF THE INVENTION

Aspects of the disclosure are set out in the independent claims and optional features are set out in the dependent claims. Aspects of the disclosure may be provided in conjunction with each other, and features of one aspect may be applied to other aspects.

In an aspect, there is provided a signal measuring apparatus comprising: signal circuitry configured to receive an input signal to be measured; and memory circuitry coupled to the signal circuitry and configured to store information representing a magnitude of a voltage or a current of the input signal. The memory circuitry comprises a first memory cell having a material which is arranged to switch from a first material state to a second material state in response to a first switching signal being applied thereto, wherein the first memory cell is tuned to a first value for the first switching signal so that a current or voltage with a magnitude at or above the first value will cause the material of the first memory cell to switch from the first material state to second material state. The apparatus is configured to apply a measurement signal indicative of the input signal to the first memory cell for switching the material of the first memory cell from the first material state to the second material state in dependence on a magnitude of the voltage or current of the measurement signal.

Embodiments may enable the provision of a smaller and/or less power hungry signal measuring apparatus. For example, the amount of power and/or circuitry required to enable a measurement value to be written to memory may be reduced compared to existing systems and methods. The signal measuring apparatus may also be made simply, and thus use fewer components. An indication of the magnitude of the voltage or current of the input signal to be measured (e.g. an indication of a measurement value, such as from a sensor) may be stored in the material state of the memory cell. The memory cells may provide a non-volatile data store, as the indication of the magnitude of the voltage or current of the input signal to be measured may remain stored in the absence of a power supply.

The signal measuring apparatus may be re-usable as the material of the first memory cell may be switchable between the first and second material states. Prior to new information representing a magnitude of a voltage or a current of the input signal being stored in the memory circuitry, the material state of the memory cell may be controlled so that it is in the first material state. For example, old information in the memory circuitry may be replaced by new information by returning the memory cell to its first material state to enable a new signal to be measured. This process of switching between material states of the memory cells may be repeated a plurality of times.

Embodiments of the present disclosure may find utility for measurement of a plurality of signals. For example, signal measuring apparatuses disclosed herein may store information representing any of: (i) sensor output signals, (ii) internal circuit signals, (iii) signals for voltage referencing applications, and/or (iv) an indication of a discharge event having occurred, such as an electrostatic discharge event. The apparatus may comprise a sensor configured to obtain at least one measurement value. For example, the apparatus may be a sensor apparatus comprising a sensor configured to obtain at least one measurement value. The input signal may comprise an output signal from the sensor, e.g. the input signal may comprise a sensor signal having a voltage or current indicative of a measurement value (e.g. a value of a property measured by the sensor). The power requirements of the sensor apparatus may be reduced as compared to other sensor apparatuses. For example, this may be because an amount of power required for the sensor of the signal measuring apparatus to obtain the measurement value may be all the power that is needed, as the resultant output voltage/current from the measurement may be sufficient to enable a measurement value to also be stored in non-volatile memory. The output from the sensor is directly written to the memory circuitry by virtue of the voltage/current of that output. The memory circuitry may comprise one or more conductors configured to transmit the output input signal (e.g. the output from the sensor) to the material of the memory cell.

The memory circuitry may comprise a second memory cell having a material which is arranged to switch from a first material state to a second material state in response to a second switching signal being applied thereto. The second memory cell may be tuned to a second value for the second switching signal so that a current or voltage with a magnitude at or above the second value will cause the material of the second memory cell to switch from the first material state to second material state. The apparatus may be configured to apply the measurement signal to the second memory cell for switching the material of the second memory cell from the first material state to the second material state in dependence on a magnitude of the voltage or current of the measurement signal. The second value may be different to the first value. The apparatus may comprise a plurality of memory cells (e.g. two or more, such as three, four, eight, sixteen etc.). Each of the plurality of memory cells may have a material which is arranged to switch from a first material state to a second material state at a respective value for a magnitude of a current or voltage of a signal applied thereto.

The inclusion of second and/or more memory cells may enable more reliable and/or more detailed information to be stored in the memory circuitry. For example, the memory cells may be tuned to the same and/or a similar value. This may improve reliability as there may be a plurality of memory cells which have registered the same change (or no change) of material state, thereby indicating that the stored information is less likely to be anomalous. For example, the memory cells may be tuned to different values. This may enable greater resolution of the stored information representing a magnitude of a voltage or current of the input signal, as this information could be more precisely defined based on at least one of: (i) the highest value to which a memory cell is tuned which has changed material state, and (ii) the lowest value to which a memory cell is tuned which has not changed material state.

A dimension of the material of the first memory cell may be selected to tune the first memory cell to the first value. For example, a cross-sectional area of the material of the first memory cell to which the measurement signal is applied may be selected to tune the first memory cell to the first value. A dimension of the material of the second memory cell may be selected to tune the second memory cell to the second value. A cross-sectional area of the material of the second memory cell to which the measurement signal is applied may be selected to tune the second memory cell to the second value. Selecting these dimensions may comprise varying the dimension in question until it is at a value which provides the desired value to which that memory cell is tuned. That is, each memory cell may have a dimension (e.g. cross-sectional area) which has been chosen so that that memory cell changes its material state at the desired value. The first and second (e.g. and other) memory cells may be the same except for one property, e.g. dimension, of their respective state changing material. This may enable these two materials to be tuned to different values. It is to be appreciated that the relevant dimension may be only one of a plurality of properties of the material which may be varied. It may be that where multiple memory cells are present, these cells differ only by this one dimension. By varying such dimensions of the memory cell, the desired tuned value for that memory cell may be obtained.

The first memory cell may be arranged to provide a first cross-sectional area of material electrically connected directly or indirectly to the sensor output. The second memory cell may be arranged to provide a second cross-sectional area of material electrically connected directly or indirectly to the sensor output. For example, depending on the intended use for the sensor circuit, the first and second cross-sectional areas may be selected to provide a desired measurement range and resolution for the input signal to be measured. The first cross-sectional area may be different to the second cross-sectional area.

The apparatus comprises a layer of electrically insulating material which defines a first window through which the measurement signal is applied to the material of the first memory cell. A dimension of the first window is selected to tune the first memory cell to the first value. For example, a cross-sectional area of the first window may be selected to define the first cross-sectional area of the material of the first memory cell to which the measurement signal is applied. The layer of insulating material may also comprise a second window through which the measurement signal is applied to the material of the second memory cell (or alternatively, a second layer of insulating material may be provided which provides the second window. The apparatus may comprise a plurality of layers or portions of electrically insulating material to provide the respective windows. A dimension of the first window is different to a dimension of the second window. The electrically insulating material may comprise any suitable material for inhibiting transmission of current therethrough. For example, the insulating material may comprise a dielectric, a relevant semiconductor arrangement, or any other suitable material.

Dimensions of the state changing material of each memory cell may be selected to tune those memory cells to their respective values. Additionally, or alternatively, other variables associated with the memory cells may be controlled to tune (or to assist in tuning) the memory cells to their respective values. For example, different types of state changing material may be used (e.g. which materials have different properties and thus give rise to different values). As another example, a temperature at which the memory cells are stored may be controlled to assist in tuning the memory cells to respective values. For example, the first and second memory cells may be configured to provide, in operation, a temperature differential between an environment surrounding the material of the first memory cell and a temperature of an environment surrounding the material of the second memory cell. The sensor circuitry may comprise one or more heating elements, so that a heater may be arranged next to one or both of these materials, e.g. to provide a selected temperature in their surrounding environment.

The material of each memory cell may comprise any suitable material which may exhibit a tangible change of material state in response to a current or voltage being applied thereto having a magnitude at or above a desired value. The selected material may have one or more properties which may be selected to enable tuning to the desired value. Example materials may include phase change materials, thin-film memory and/or RRAM.

The material of each memory cell may comprise a phase change material having an electrically conductive state and an electrically non-conductive state. The phase change material may comprise an amorphous-crystalline phase change material, such as a phase change material which exhibits reversible transition amorphous-crystalline phase changes. The phase change materials may switch between electrically non-conductive (e.g. amorphous) and electrically conductive (e.g. crystalline) states (e.g. they may switch from one to the other, and vice versa). That is, the application to a phase change material of a voltage having a magnitude at or above the threshold voltage for that phase change material may cause that phase change material to change from its electrically non-conductive state into its electrically conductive state. Application to that phase change material of a current or a voltage having an amplitude at or above the threshold current for that phase change material may cause that phase change material to change from its electrically conducting state into its electrically non-conducting state. This process of phase changes may be repeated a plurality of times. For each phase change material, switching between the electrically non-conductive state and the electrically conductive state may comprise switching from the electrically non-conductive state to the electrically conductive state and/or switching from the electrically conductive state to the electrically non-conductive state.

The first material state of the phase change material of the first memory cell may be the electrically non-conductive state. The second material state of the phase change material of the first memory cell may be the electrically conductive state. The first memory cell may be arranged to switch from the electrically non-conductive state to the electrically conductive state in response to a voltage with a magnitude greater than the first value being applied thereto.

The first material state of the phase change material of the first memory cell may be the electrically conductive state.

The second material state of the phase change material of the first memory cell may be the electrically non-conductive state. The first memory cell may be arranged to switch from the electrically conductive state to the electrically non-conductive state in response to a current or voltage having a magnitude greater than the first value being applied thereto.

The apparatus may be configured to apply a reverse switching signal to the first memory cell, wherein an amplitude and/or duration of the reverse switching signal is selected to switch the material of the first memory cell from the second material state to the first material state. For example, the reverse switching signal may comprise applying a current or voltage having a magnitude and/or duration above a reverse switching threshold. For example, the reverse switching signal may be selected to exhibit a SET or a RESET phase change in the material (e.g. depending on which phase change occurs from the first material state to the second material state). A SET phase change may be triggered by application of a voltage pulse having a magnitude at or above a SET threshold value. A RESET phase change may be triggered by application of a voltage or current pulse having a magnitude at or above a RESET threshold value. The RESET threshold value may be higher than the SET threshold value. The RESET pulse may be shorter in duration than the SET pulse. The apparatus may be configured for respective application of a current or voltage above the relevant threshold level to restore the phase change material to the first material state.

The sensor circuitry may be configured to provide a said sensor output representing an output current indicative of said measurement value. The signal circuitry may comprise a current switch configured to receive the input signal and to apply the measurement signal to each of the memory cells. A magnitude of the current of the measurement signal may be indicative of a magnitude of the current of the input signal. The current switch may be configured to sequentially apply the measurement signal to each of the memory cells. The current switch may be configured to apply an identical current waveform to each of the memory cells. The current switch may be configured to apply the measurement signal to each of the memory cells for the same duration of time.

Apparatuses disclosed herein may comprise a radio frequency transceiver and power harvesting circuitry for harvesting power received from the radio frequency transceiver. The apparatus may be configured to power the signal circuitry, sensor circuitry and/or memory circuitry based on power harvested from the radio frequency transceiver. The apparatus may be configured to transmit an indication of said information representing said measurement value (the indication representing a magnitude of a voltage or current of the input signal) stored in the memory circuit using the radio frequency transceiver.

The apparatus may be configured to modify the input signal to provide the measurement signal to be applied to the first memory cell and/or to one or more of the plurality of memory cells. The apparatus may comprise a first resistor arranged to modify the input signal to provide the measurement signal to be applied to the first memory cell. The apparatus may comprise a plurality of resistors. A resistance of the first resistor may be selected to tune the first memory cell to the first value. Each resistor may be arranged to reduce the magnitude voltage or current indicative of said measurement value applied to a memory cell. The memory circuitry may comprise at least two resistors. Each resistor may be arranged to reduce the magnitude of the voltage or current indicative of said measurement value applied to a different respective memory cell. Each resistor may provide a different reduction in the magnitude of the voltage or current indicative of said measurement value applied to its respective memory cell. The apparatus may comprise a second resistor configured to modify the input signal to provide the measurement signal to be applied to the second memory cell, wherein the resistance of the second resistor is selected to tune the second memory cell to the second value. The first and second resistances may be different.

The memory cell(s) may be connected to a reference voltage. At least one of the memory cells may be arranged to provide resistance to current in the event that it transitions into an electrically conductive state, thereby to inhibit current flowing through that memory cell instead of being applied to other memory cells. For example, at least one of the memory cells may be connected to a current-sense resistor and/or a current-limiting resistor.

The sensor circuit may comprise: a first conductor arranged to transmit the sensor output to the material of the first memory cell, and a second conductor arranged to transmit the sensor output to the material of the second memory cell. The sensor circuit may further comprise a third conductor connected to the first memory cell and arranged to receive a current from the first conductor in the event that the material of the first memory cell is in an electrically conductive material state. The sensor circuit may further comprise a fourth conductor connected to the second memory cell and arranged to receive a current from the second conductor in the event that the material of the second memory cell is in an electrically conductive material state.

At least one of the third conductor and the fourth conductor may be connected to a reference voltage (e.g. both may be connected to a reference voltage, such as the same reference voltage). The reference voltage may be zero, or it may be a voltage greater than zero, e.g. as provided by another component of the sensor circuit. At least one of the conductors may be connected to a current-limiting/current-sense resistor. Such resistor may be provided at the input or output of the array. For example, at least one of the first and the second conductor may be connected to said resistor, and/or at least one of the third conductor and the fourth conductor may be connected to said resistor. For example, each of the first and second, and/or third and fourth conductors may be connected to a current-limiting/sense resistor. Conductors may be connected to the same resistor, or to their own respective resistor. These one or more resistors may be connected in series to their respective memory cell via their respective conductor. Current-limiting/sense resistor(s) may be connected in series with the memory cell(s).

In aspect, there is provided a sensor apparatus comprising: sensor circuitry comprising a sensor configured to obtain at least one measurement value, wherein the sensor circuitry is configured to provide a sensor output representing one of an output voltage indicative of said measurement value and an output current indicative of said measurement value; and memory circuitry configured to store information representing said measurement value obtained by the sensor. The memory circuitry comprises: at least a first memory cell and a second memory cell wherein each memory cell is respectively formed of a phase change material having an electrically conductive and an electrically non-conductive state. For example, each phase change material may have a threshold voltage at which the phase change material switches from the electrically non-conductive state to the electrically conductive state. For example, each phase change material may be switchable from the electrically conductive state to the electrically non-conductive state (e.g.

in response to a reverse threshold voltage or current, the phase change material switches from the electrically conductive state to the electrically non-conductive state). The sensor circuitry is configured to apply the sensor output to the memory circuit for switching the phase change material of at least one of said memory cells between the electrically non-conductive state and the electrically conductive state whereby to store said information representing said measurement value in said memory circuitry. The memory circuitry and memory cells are mutually configured to switch the phase change material of the first memory cell between the electrically non-conductive state and the electrically conductive state at a first sensor output value, and the phase change material of the second memory cell between the electrically non-conductive state and the electrically conductive state at a second sensor output value. The first sensor output value is different to the second sensor output value.

In an aspect, there is provided a sensor apparatus comprising: sensor circuitry comprising a sensor configured to obtain at least one measurement value, wherein the sensor circuitry is configured to provide a sensor output representing an output voltage indicative of said measurement value; and memory circuitry configured to store information representing said measurement value obtained by the sensor. The memory circuitry comprises: at least a first memory cell and a second memory cell wherein each memory cell is respectively formed of a phase change material having an electrically conductive and an electrically non-conductive state and having a threshold voltage at which the phase change material switches from the electrically non-conductive state to the electrically conductive state. The sensor circuitry is configured to apply the sensor output to the memory circuit for switching the phase change material of at least one of said memory cells from its electrically non-conductive state to its electrically conductive state to store said information representing said measurement value in said memory circuitry. The memory circuitry and memory cells are mutually configured to switch the phase change material of the first memory cell from the electrically non-conductive state to the electrically conductive state at a first threshold voltage, and the phase change material of the second memory cell from the electrically non-conductive state to the electrically conductive state at a second threshold voltage. The first threshold voltage is different to the second threshold voltage.

In an aspect, there is provided a sensor apparatus comprising: sensor circuitry comprising a sensor configured to obtain at least one measurement value, wherein the sensor circuitry is configured to provide a sensor output representing an output current indicative of said measurement value; and memory circuitry configured to store information representing said measurement value obtained by the sensor. The memory circuitry comprises: at least a first memory cell and a second memory cell wherein each memory cell is respectively formed of a phase change material having an electrically conductive and an electrically non-conductive state and having a threshold current at which the phase change material switches from the electrically conductive state to the electrically non-conductive state. The sensor circuitry is configured to apply the sensor output to the memory circuit for switching the phase change material of at least one of said memory cells from the electrically conductive state to the electrically non-conductive state to store said information representing said measurement value in said memory circuitry. The memory circuitry and memory cells are mutually configured to switch the phase change material of the first memory cell from the electrically conductive state to the electrically non-conductive state at a first threshold current, and the phase change material of the second memory cell from the electrically conductive state to the electrically non-conductive state at a second threshold current. The first threshold current is different to the second threshold current.

In an aspect, there is provided a sensor apparatus comprising: sensor circuitry comprising a sensor configured to obtain at least one measurement value, wherein the sensor circuitry is configured to provide a sensor output representing an output voltage or an output current indicative of said measurement value; and memory circuitry configured to store information representing said measurement value obtained by the sensor. The memory circuitry comprises: at least a first memory cell and a second memory cell wherein each memory cell is respectively formed of a phase change material having an electrically conductive and an electrically non-conductive state and having a threshold voltage or current at which the phase change material switches state (e.g. from the electrically non-conductive state to the electrically conductive state, or vice versa). The sensor circuitry is configured to apply the sensor output to the memory circuit for switching the state of at least one of the phase change materials whereby to store said information representing said measurement value in said memory circuitry. The memory circuitry is configured to modify the sensor output to provide a first voltage or current applied to the phase change material of the first memory cell which is different to a second voltage or current applied to the phase change material of the second memory cell. For example, a first sensor output value at which the phase change material of the first memory cell changes phase may be different to a second sensor output value at which the phase change material of the second changes phase.

BRIEF DESCRIPTION OF THE SEVERAL VIEWS OF THE DRAWINGS

Some examples of the present disclosure will now be described, by way of example only, with reference to the figures, in which.

In the drawings like reference numerals are used to indicate like elements.

DESCRIPTION OF SPECIFIC EMBODIMENTS OF THE INVENTION

Figure 1:
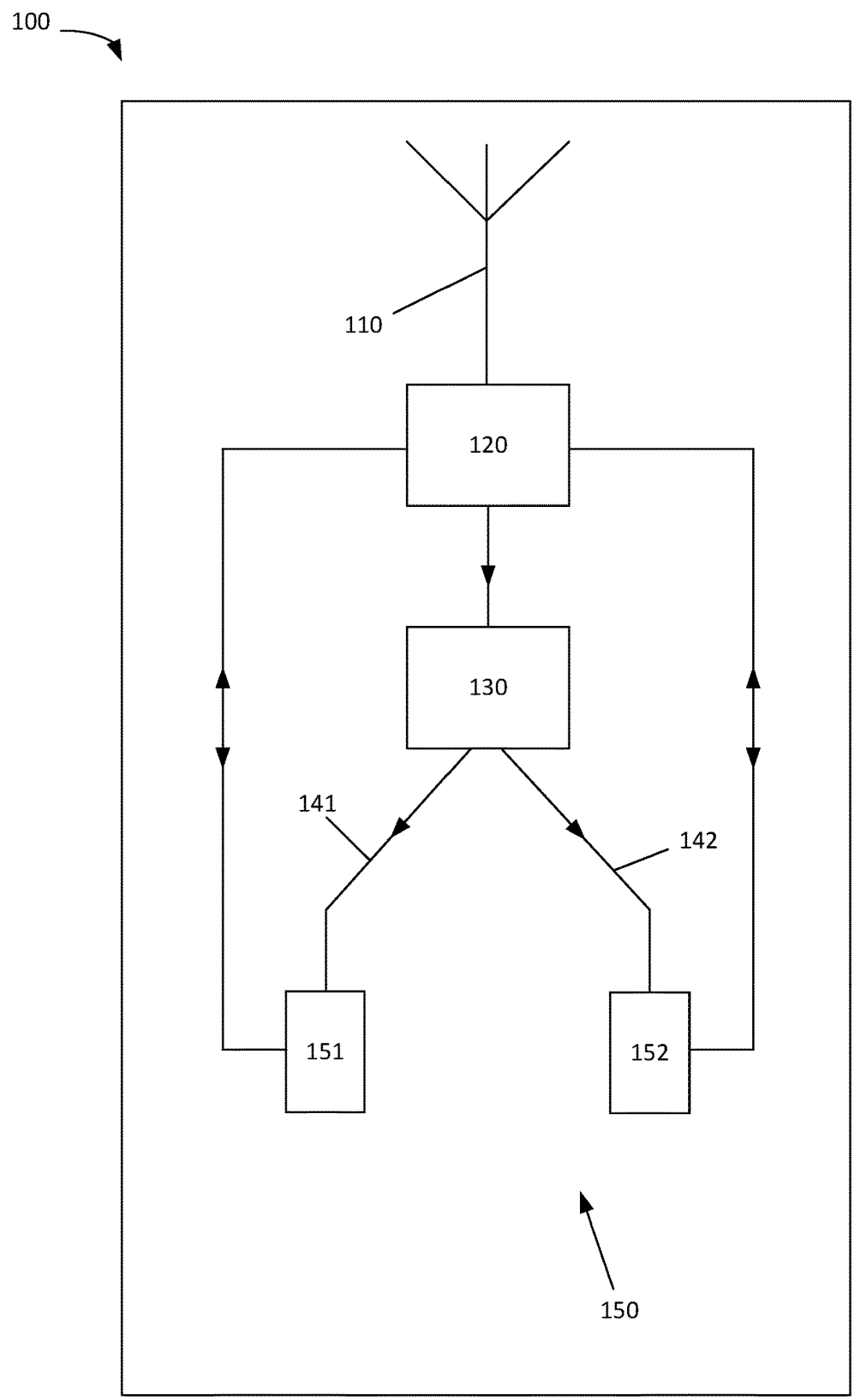
FIG. 1 is a simplified block schematic of a sensor apparatus.

FIG. 1 is a simplified block schematic of a sensor apparatus 100.

The sensor apparatus 100 in this example is provided with a radiofrequency transceiver which includes an antenna 110 and antenna control circuitry 120. The radiofrequency transceiver is configured to receive RF radiation via the antenna 110 and to transmit this to the antenna control circuitry 120. The antenna control circuitry 120 typically includes energy harvesting circuitry including a rectifier for harvesting power from the received RF radiation. The power harvesting circuitry may also include an RC circuit. The antenna control circuitry 120 also controls radiation and/or data, such as stored data, to be transmitted using the antenna 110.

The sensor apparatus 100 includes sensor circuitry. In FIG. 1, the sensor circuitry comprises a sensor 130. The sensor 130 is configured to obtain at least one measurement value. This may be a measurement value for a property of the surrounding environment to the sensor 130, e.g. the sensor 130 may be a humidity sensor. The sensor 130 is configured to provide a sensor output representing one of: (i) an output voltage with a magnitude indicative of said measurement value, and (ii) an output current with a magnitude indicative of said measurement value. In this example, the sensor 130 output represents a voltage indicative of each measurement value, e.g. the voltage output might indicate the measurement of humidity. In this example, the sensor 130 is configured to receive power from the antenna control circuitry 120.

The sensor apparatus 100 comprises signal circuitry configured to receive an input signal to be measured. The input signal is the sensor output, such that the input signal represents a voltage having a magnitude indicative of the sensor's measurement value. It is to be appreciated in the context of the present disclosure that references herein to voltage/current refer to a magnitude of this voltage/current. This input signal is used to write the measurement value to storage. The sensor apparatus 100 also includes memory circuitry 150. The sensor apparatus 100 is configured to use the voltage output from the sensor 130 to write the measurement value to the memory circuitry 150.

The sensor apparatus 100 beneficially utilises materials having two or more material states, where the material switches between these material states in response to application of a threshold voltage/current thereto. In this example, phase change materials are used. The phase change materials facilitate the writing of a measurement value to the memory circuitry 150. The data written to the memory circuitry 150 is dependent on the voltage output from the sensor 130. In the example shown, the memory circuitry 150 includes a first memory cell 151 and a second memory cell 152. Each memory cell is formed of phase change material. The first memory cell 151 is connected to the sensor 130 via a first conductor 141, and the second memory cell 152 is connected to the sensor 130 via a second conductor 142.

The phase change material of the first and second memory cells is configured to change between two phases. In the first phase, the phase change materials are electrically non-conducting or have a very high electrical resistance and inhibit the flow of current therethrough. Thus, when a voltage is applied to the phase change material when it is in its first phase, current will not flow through the phase change material, or such current will be of a very small value. In the second phase, the phase change materials are electrically conducting or have a much lower electrical resistance and facilitate the flow of current therethrough. Thus, when a voltage is applied to the phase change material when it is in its second phase, current will flow through the phase change material.

Each memory cell may have a threshold voltage associated therewith at which the phase change material switches from its first phase (e.g. non-conductive) to its second phase (e.g. conductive). Alternatively, or additionally, each memory cell may have a threshold current or voltage associated therewith at which the phase change material switches from its second phase (e.g. conductive) to its first phase (e.g. non-conductive). Embodiments of the present disclosure apply a voltage or current to memory cells and utilise the threshold voltage or current of the memory cells to store information in the memory circuitry 150 based on the phase of the memory cells. The phase of the memory cells will indicate how the sensor output voltage/current compares to the threshold voltages/currents associated with the memory cells.

It is to be appreciated that each memory cell may be arranged to provide a selected threshold value at which a phase change of the phase change material occurs. Reference herein to the memory cell changing phase refers to a change in phase of the phase change material of that memory cell.

In this example, the sensor output is an output voltage representative of a measurement value obtained from the sensor. The first memory cell 151 is arranged so that the phase change material of that cell changes phase at a first value. In other words, the first memory cell 151 is tuned to that first value. The second memory cell 152 is arranged so that the phase change material of that cell changes phase at a second value (it is tuned to that second value). The first memory cell 151 and the second memory cell 152 are arranged so that the first and second value are different. The first and second memory cells are arranged to have different threshold voltages at which they switch from their electrically non-conductive state to their electrically conductive state. That way, the number of memory cells which have changed phase will be representative of a voltage output from the sensor, which is itself indicative of the measurement value. This indication of the measurement value will be relative to the threshold voltages of the memory cells (i.e. to the first and second value). In this example, the first value is below the second value.

If neither memory cell in the memory circuitry 150 has had a phase change, then it may be determined that a value for the measurement corresponds to an output voltage below the first value. If only one of the first and second memory cells has had a phase change (which in this example should be the first memory cell as the first value is lower than the second value), then it may be determined that the measurement value corresponds to an output voltage between the first and second values. If both the first and second memory cells have had a phase change, then it may be determined that the measurement corresponds to an output voltage above the second value.

The sensor apparatus 100 is therefore arranged to enable information representing a measurement value to be stored in the memory circuitry 150 in dependence on the voltage output from the sensor 130. In particular, the number of memory cells having had a phase change will be dependent on the voltage output from the sensor 130. That way, the measurement value may be determined based on the number of cells in the memory circuitry 150 having had a phase change. Each memory cell having had a phase change will indicate that the output voltage is above a threshold voltage associated with that memory cell. A range may be defined for the measurement value based on the highest threshold voltage associated with a memory cell which has had a phase change, and the next highest threshold voltage associated with a memory cell (e.g. the lowest threshold voltage associated with a memory cell which has not had a phase change).

It will be appreciated in the context of the present disclosure that a plurality of different memory cells may be provided. In this example, each such different memory cell may have a different threshold voltage. The number of memory cells provided, and their respective threshold voltages, may be selected to accommodate a desired range of measurements, or to provide a desired level of precision for measurement values. For example, the threshold voltages may conform to a numerical series, such as a geometric series.

The information representing a measurement value stored in the memory circuitry 150 may correspond to a number of memory cells which have had a phase change in response to the measurement signal being applied thereto. Based on the number of memory cells which have had a phase change, a lower limit may be determined for the output voltage (e.g. that lower limit being the highest threshold voltage associated with a memory cell of the memory circuitry 150 to have changed phase). Based on the indication of the output voltage, the measurement value may be determined (e.g. there may be a known correspondence between the measurement value and the output voltage from the sensor 130).

Measurement values obtained by the sensor 130 may therefore be stored in the memory circuitry 150. This storing may consume less power than alternative methods, and so may find utility with low power sensors, such as sensors whose power is supplied solely by radio transmission. The sensor apparatus may also experience less degradation with use. For example, more read/write cycles may be performed using this arrangement than is possible with alternative methods.

The memory circuitry 150 may provide non-volatile memory, as the phase of the phase change materials will remain the same in the absence of power. An obtained input signal to be measured (e.g. a measurement value) may remain in the memory circuitry 150 despite the sensor apparatus 100 being on or off (in the presence or absence of power). The memory circuitry 150 may be connected to the antenna control circuitry 120 to enable transmission of stored data using the antenna 110. As shown in FIG. 1, each of the first memory cell 151 and the second memory cell 152 may be connected to the antenna control circuitry 120. For example, the antenna control circuitry 120 may be configured to apply a small voltage/current to each memory cell to determine what state the memory cell is in (e.g. by identifying the resistance of phase change material of that memory cell). Based on this, the antenna 110 may be used to transmit an indication of the measurement value.

Any suitable material may be used which exhibits a change of material state from a first material state to a second material state in response to an application of current or voltage having a magnitude above a threshold value. In this example, phase change materials are used. The phase change material may comprise a material with a reversible amorphous-crystalline phase change. The transition from the crystalline phase to the amorphous phase may be referred to as the 'Reset' process, and the transition from the amorphous phase to the crystalline state may be referred to as the 'Set' process. In the amorphous phase, the material may have a high electrical resistance, and so is substantially electrically non-conductive. In the amorphous phase, the phase change material inhibits the transmission of an electrical current therethrough. In the crystalline phase, the material may have a lower electrical resistance, and so is electrically conductive. In the crystalline phase, the phase change material may enable transmission of an electrical current therethrough. The electrical resistance of the phase change material may differ substantially between its amorphous and crystalline states. For example the electrical resistance of the phase change material when in its amorphous state may be approximately 2, 3, 4, 5, or 6 orders of magnitude higher than when in its crystalline state (e.g. it may be 2 or more orders of magnitude higher). It should be understood that references throughout this document to a non-conductive phase apply to phase change material in its amorphous phase, and that references to a conductive phase apply to phase change material in its crystalline phase.

Some phase change materials in the amorphous phase have a high electrical resistance until a SET threshold signal (e.g. pulse) is applied thereto. The SET threshold signal will be a signal having an amplitude and/or duration selected to cause a 'snap-back' to take place where the material changes into a state with a much lower electrical resistance (i.e. the Set process occurs). Typically, applying the SET threshold signal to a phase change material comprises a voltage having a magnitude at or above a SET threshold voltage. The voltage may be applied for a threshold period of time before the SET process occurs.

Some phase change materials in the crystalline phase have a low electrical resistance until a RESET threshold signal (e.g. pulse) is applied. The RESET threshold signal will be a signal having an amplitude and/or duration selected to cause the phase change material to change into the amorphous phase in which the material has a high electrical resistance (i.e. a RESET process occurs). Applying the RESET threshold signal may comprise applying a current or a voltage to the phase change material. Some phase change materials may undergo a RESET process in response to application of a current above a RESET threshold current and/or application of a voltage above a RESET threshold voltage. A RESET threshold voltage may be greater than a SET threshold voltage. The RESET threshold signal may be applied for less time than a SET threshold signal (e.g. it may be a short pulse of high magnitude, as opposed to a longer pulse of lower magnitude).

Once a SET threshold signal (e.g. a voltage) has been applied (and the phase change material has changed into the low-resistance state), the phase change material will remain in the low-resistance state, for example until a RESET threshold signal is applied thereto (e.g. a current at or above the RESET threshold current). The measurement value may be identified based on the phase of the phase change materials, as they will remain in the same phase, and so their phase will indicate whether or not they received a voltage greater than their threshold voltage.

The sensor apparatus may be arranged to facilitate re-writing to the memory cells after a measurement value for an input signal has been stored in the memory cells of the memory circuitry. For this, the sensor apparatus is configured to apply a 'RESET' signal (e.g. a current or voltage above the RESET threshold) to the memory cells so that they are all in the high resistance amorphous phase. For example, the apparatus may be configured to apply a reset current to each of the phase change materials in the memory circuitry 150. This may facilitate re-writing to those memory cells, as subsequent application of a measurement signal to the memory cells will cause those memory cells to switch phase, or not, so as to store said measurement signal in the memory circuitry.

One or more properties of the memory cells may be selected to provide the different threshold voltages and/or currents at which the memory cells will switch from one material state to another. For example, the memory cells may be configured to provide different dimensions of phase change material, the apparatus may be operated to provide a controlled temperature in the environment surrounding each memory cell (e.g. memory cells may be at different temperatures), and/or different phase change materials may be used in different memory cells. In one example, the memory cells are arranged to control the cross-sectional area of phase change material in contact with an input conductor. The cross-sectional area of phase change material is selected to provide a desired threshold voltage. The memory cells may be connected directly or indirectly to the sensor output (e.g. via a conductor), and the area of contact between the phase change material and this sensor output is selected to provide the desired threshold voltage at which a change of phase occurs. By varying the cross-sectional area of the phase change material in contact with the conductor, it may be possible to tune each memory cell to a respective threshold voltage, e.g. so that these threshold voltages may be selected to enable the desired functionality and/or resolution for storing data.

Sensor Apparatus

One example of a sensor apparatus 200 will now be described with reference to FIG. 2. The sensor apparatus 200 is configured to provide a direct write for measurement values into non-volatile memory in the memory circuitry 150.

Figure 2:
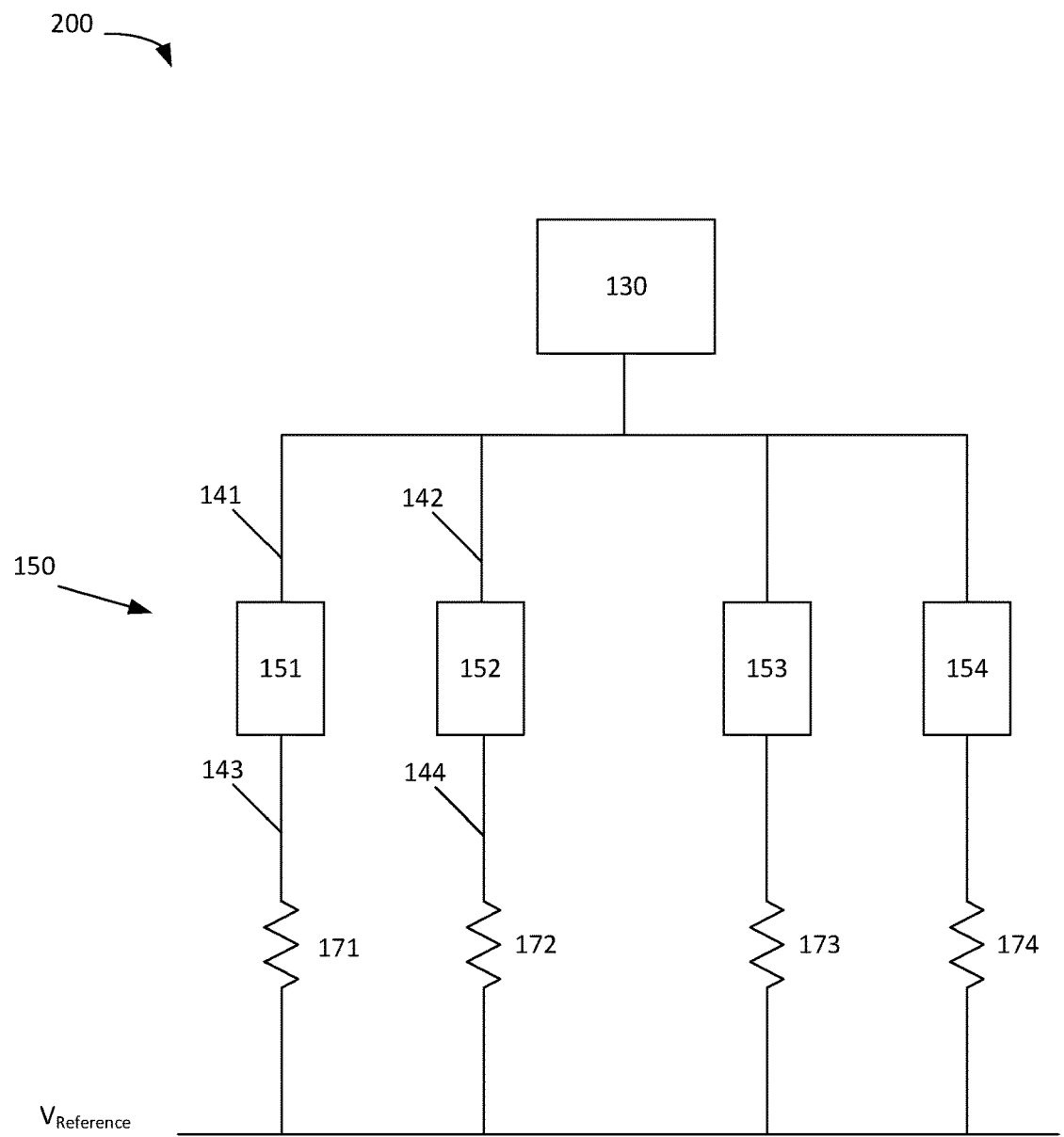
FIG. 2 is a simplified block schematic of a sensor apparatus.

FIG. 2 shows sensor apparatus 200. As with the circuit 100 shown in FIG. 1, the circuit 200 of FIG. 2 includes sensor circuitry including a sensor 130. The circuit 200 also includes memory circuitry 150 comprising first and second memory cells 151, 152 formed of phase change material. Additionally, the circuit 200 includes a third memory cell 153 and a fourth memory cell 154, also formed of phase change material.

The sensor apparatus 200 includes a first conductor 141 which connects the output voltage from the sensor 130 to the first memory cell 151, and a second conductor 142 which connects the output voltage from the sensor 130 to the second memory cell 152. The sensor apparatus 200 also includes a third conductor 143 which is connected to an opposite side of the first memory cell 151 to the first conductor 141. The sensor apparatus 200 includes a fourth conductor 144 which is connected to an opposite side of the second memory cell 152 to the second conductor 142. Similar arrangements are shown (without reference numerals) for the third and fourth memory cells.

The circuit 200 also includes first, second, third and fourth current limiting resistors 171, 172, 173, 174. Each of the current limiting resistors is connected in series to a respective memory cell. For example, the first current-limiting resistor 171 is connected to the first memory cell 151, such as via the third conductor 143. Similar arrangements are shown for the other current-limiting resistors and memory cells.

The sensor 130 is connected to each of the four memory cells. The memory cells are connected to each other in parallel. Each memory cell is connected to a respective current limiting resistor. Each memory cell connected to its respective current limiting resistor in series. The circuitry 200 defines four paths for a sensor output representing a voltage output from the sensor 130, where each path delivers the voltage output to a respective memory cell of the memory circuitry 150.

The sensor circuitry is configured to provide a sensor output representing an output voltage indicative of a measurement value obtained by the sensor 130. It will be appreciated in the context of the present disclosure that any suitable sensor may be provided. The output voltage from the sensor 130 provides an indication of the measurement value, and so based on this output voltage, the measurement value may be determined. For example, there may be a known mapping between output voltage and measurement value.

Each of the memory cells may be switched between a first electrically non-conductive phase, and a second electrically conductive phase. The circuitry 200 is arranged so that, for phase change material in the first phase (electrically non-conducting), no meaningful current is transmitted through the phase change material, which therefore supports an applied voltage (potential difference) placed across it. As such, no current associated with the sensor output voltage will be registered on the side of the memory cell opposite to the side which receives the voltage output from sensor 130. For example, the third conductor 143 will not receive a substantial current associated with the sensor voltage from the first conductor 141 when the phase change material is in the first (electrically non-conducting) phase.

For phase change material in the second phase (electrically conducting), a current will be transmitted through the phase change material. A current associated with the sensor output voltage may therefore be received on the opposite side of the phase change material to the conductor providing the sensor output voltage. For example, the fourth conductor 144 may receive a current based on the sensor voltage provided to the second memory cell 152 via the second conductor 142 when phase change material of the second memory cell 152 is in the second (electrically conducting) phase.

Each current limiting resistor is connected to its respective memory cell to limit the current of any transmission through phase change material of that memory cell. This current limiting may inhibit any changes to the impedance of the sensor apparatus 200, e.g. to facilitate the same, or intended, voltage being applied to each of the memory cells. Each of the memory cells may be connected to a reference voltage. As shown, each of the memory cells may be connected to the reference voltage on the opposite side of the memory cell to the sensor 130. The reference voltage may be zero, or it may be another voltage as provided by another component of the circuit 200.

Each of the memory cells has a threshold voltage at which the phase change material of that memory cell will switch phase. In the event that the threshold voltage is applied to the phase change material in the first (electrically non-conducting) phase, the phase change material will switch to the second (electrically conducting) phase. This may be referred to as a 'set' process, and a 'set threshold voltage'. Therefore, in the event that a voltage above the threshold voltage is applied to the phase change material, a phase change will occur. The four memory cells are arranged to have different threshold voltages. A higher voltage output from the sensor 130 may therefore result in a greater number of the memory cells switching phase. The number of memory cells of the memory circuitry 150 having switched phase will provide an indication of the voltage output from the sensor 130.

Each memory cell of the memory circuitry 150 which has changed phase may indicate that the sensor output voltage is greater than the phase change threshold voltage of phase change material of that memory cell. The absence of a change of phase of a memory cell may indicate that the sensor output voltage is less than the threshold voltage of phase change material of that memory cell. For example, in the event that the first and second memory cells changed phase, but not the third or fourth, it may be determined that the voltage output from the sensor 130 was greater than the first and second threshold voltages, but less than the third and fourth threshold voltages. If the third threshold voltage was the next highest after the second threshold voltage, it may be determined that the sensor output voltage is between the second and third threshold voltages.

In the example shown, the measurement value stored in the memory circuitry 150 may fall within one of five ranges. That is, it may be below the first threshold voltage, between first and second threshold voltages, between second and third threshold voltages, between third and fourth threshold voltages, and above the fourth threshold voltage.

In operation, the sensor 130 obtains a measurement and provides an output voltage indicative of this measurement value. This output voltage is received as an input signal to the signal circuitry, which provides a measurement signal to each of the first, second, third and fourth memory cells. The measurement signal is indicative of the output voltage (in this case, the two are the same). Each of the first to fourth memory cells will either change phase, or not. The memory circuitry 150 has four memory cells, each formed of a phase change material, and the phase of the phase change material of each memory cell will provide an indication of the measurement value. After the measurement voltage has been applied to the memory cells, they will have either changed phase or not. A small interrogation voltage is then applied to each of the memory cells to determine which phase each memory cell is in. If the applied interrogation voltage results in a current above a minimum size passing through the memory cell, it may be determined that the relevant phase change material is in its second (electrically conducting) phase, and that the sensor output voltage was greater than the threshold voltage associated with that phase change material.

A small interrogation voltage may be applied to each memory cell until the result has been identified. For example, an interrogation voltage may be first applied to the memory cell having the highest threshold voltage, and then subsequently to each lower threshold voltage, until a first memory cell is found which is in its second (electrically conducting) phase. The voltage output from the sensor 130 may then be identified based on the threshold voltage of that memory and the threshold voltage of the next highest memory cell. The interrogation voltage may be of a suitable size to inhibit any Set or Reset process occurring in the phase change material of the memory cell being interrogated.

Phase Change Materials

It will be appreciated in the context of the present disclosure that any suitable phase change material may be provided. Suitable phase change materials may include those having an amorphous-crystalline phase change where the different phase of the material will either be electrically conducting, or not. The phase change materials may have a reversible amorphous-crystalline phase change. This phase change may be reversed a large number of times. Example materials may include use of Germanium-Antimony-Tellurium (GST) phase change materials and/or Gallium-Lanthanum-Sulphide phase change materials.

To provide different phase change threshold voltages, different phase change materials may be used and/or a different arrangement of the memory cells may be provided. The memory cells may be arranged to provide a different arrangement of phase change material, such as to provide a selected dimensions/geometry for phase change material of that memory cell. For a given phase change material, its threshold voltage and/or current may be tailored to a specific value by varying one or more parameters of the memory cell for that phase change material, and/or the surrounding environment of that memory cell. These parameters may include geometric properties of the phase change material and/or properties of the phase change material's environment. Parameters may include one or more of: (i) a length of phase change material between the side of the memory cell connected to the input voltage from the sensor 130 and the opposite side (e.g. a side connected to an output conductor to a current-limiting resistor and/or reference voltage), (ii) a cross-sectional area of phase change material in contact with the sensor output current/voltage, and/or (iii) a temperature of the memory cell.

Figure 6A:
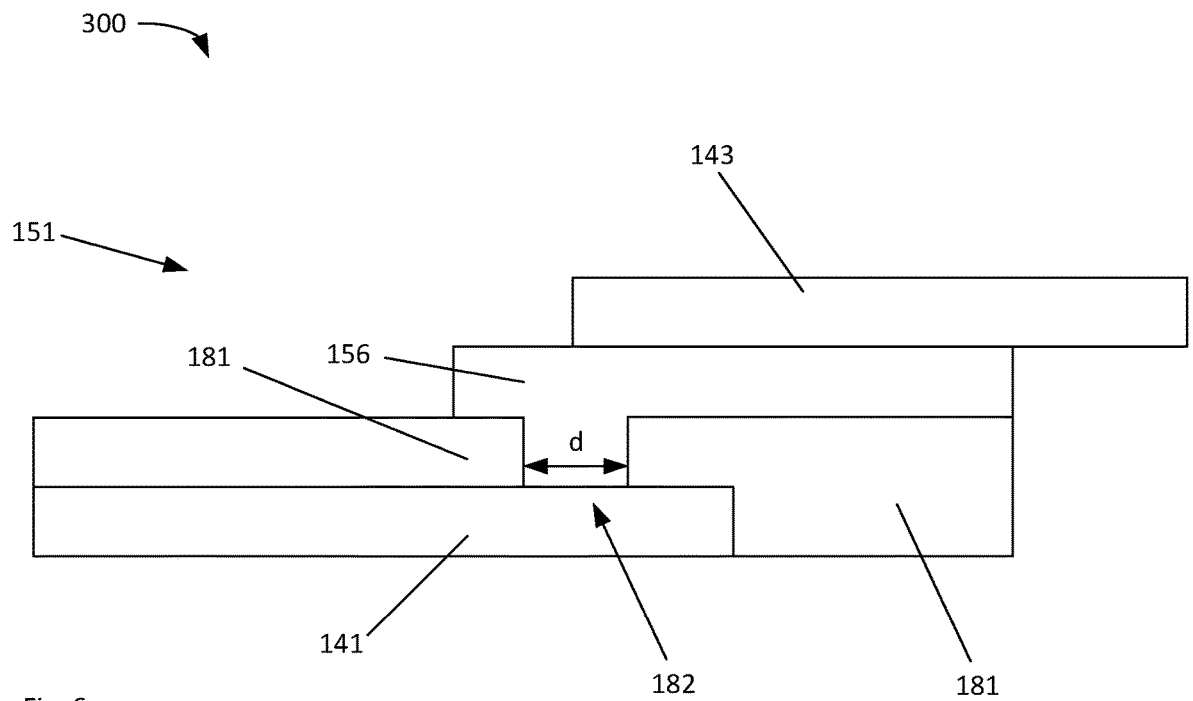
FIGS. 6a and 6b each show a schematic diagram of a connection between two conductors separated by a phase change material.
Figure 6B:
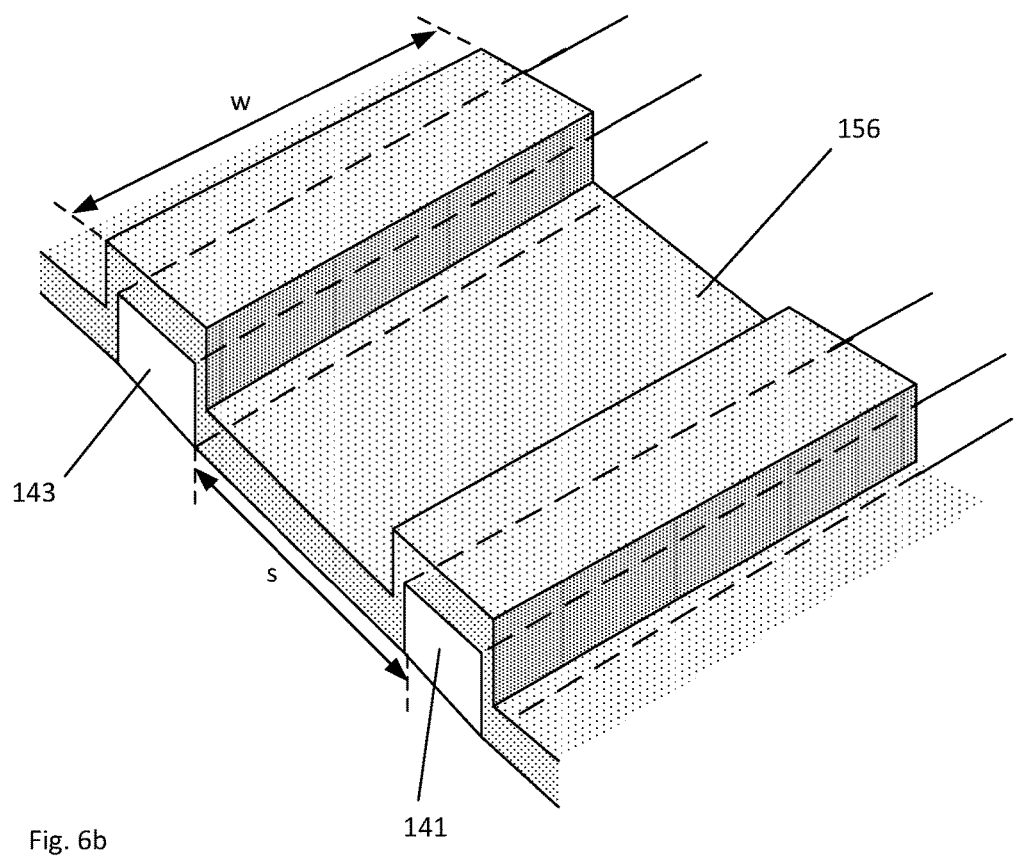

Examples of an arrangement for phase change material of a memory cell will now be described with reference to FIGS. 3, 6a and 6b.

Figure 3:
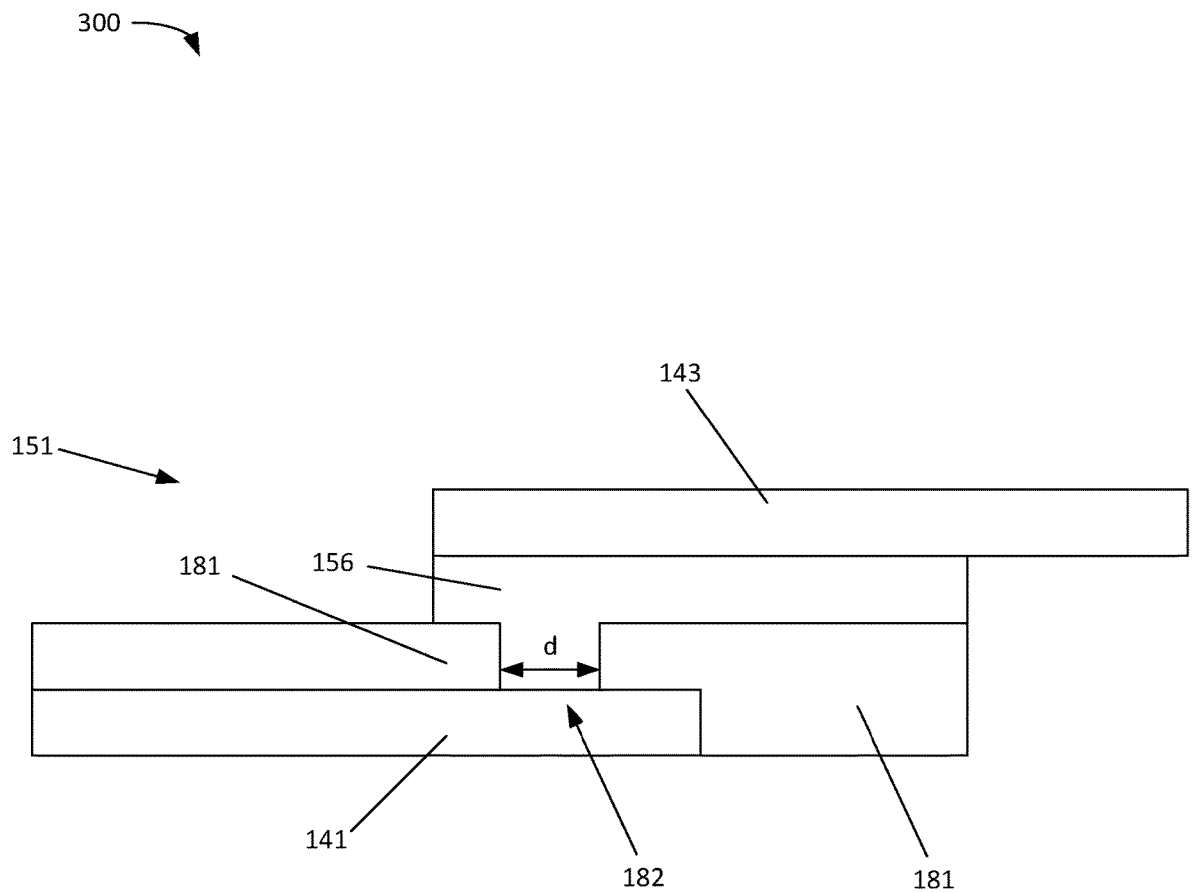
FIG. 3 is a cross-section view of a connection between two conductors separated by a phase change material.

FIG. 3 shows a cross-section view of a connection 300 between the first conductor 141 and the third conductor 143, via the first memory cell 151. The first memory cell 151 includes phase change material 156. The connection 300 includes an electrical insulator 181, such as a dielectric. The connection 300 is arranged so that the first conductor 141 does not directly contact the third conductor 143. The first conductor 141 is separated from the third conductor 143 by the phase change material 156 and the dielectric 181. A window 182 is defined in the electrical insulator 181 having a width d, through which the phase change material 156 is exposed to the first conductor 141. The window 182 may enable a connection between the first conductor 141 and the phase change material 156. This connection between the first conductor 141 and the phase change material 156 may provide a connection (direct or indirect) between phase change material 156 and the sensor output (e.g. the representation of the current/voltage indicative of the measurement value). The window 182 may be circular, rectangular or any other shape, in plan view.

The phase change material 156 is in contact with the first conductor 141 through the window 182. The phase change material 156 is also in contact with the third conductor 143. In the Fig. the third conductor 143 overlies the phase change material 156. The first conductor 141 is located underneath the phase change material 156 and the electrical insulator 181. In other examples, the third conductor 143 may instead be located underneath the phase change material 156, and the first conductor 141 may overlie the first phase change material 156.

In further examples, the connection between the second conductor 143 and the phase change material 156 may be positioned partly over the window 182. This arrangement is illustrated in FIG. 6a. Such examples may allow further control over the phase change threshold voltage, in addition to that provided by the dimensions of the window 182.

Yet further examples employ a lateral arrangement of first conductor 141, phase change material 156 and third conductor 143. Examples may include fully lateral arrangements (i.e. with no vertical separation). One such example is illustrated in FIG. 6B. In this example, phase change material 156 is in the form of a layer positioned between first and third conductors 141 and 143. The phase change material lies in the same plane as, or a plane parallel to, first and third conductors 141 and 143. In such examples the phase change threshold voltage may be influenced by the separation of the first and third conductors, s, the width of the layer of phase change material, w, the thickness of the layer of phase change material, the material composition, and so on. It will be understood that many specific geometries are possible and are more or less practicable depending on, for example, the methods of manufacture of the cell.

The window 182 in the electrical insulator 181 is arranged to have a selected cross-sectional area through which the phase change material 156 may contact the first conductor 141. The size of the selected cross-sectional area is selected to provide a desired threshold voltage and/or current for the phase change of the phase change material 156. It has been found that this first threshold voltage and/or current may scale inversely with the cross-sectional area of the phase change material in contact with the conductor applying the current and/or voltage associated with the sensor output. For a greater cross-sectional area, the threshold voltage and/or current decreases. The cross-sectional area of the window 182 may be selected to control the threshold voltage and/or current of the phase change material. Other parameters such as film thickness/separation length between input and output conductors may also influence these thresholds.

To provide a sensor apparatus with different threshold voltages, a plurality of connections of the type shown in FIG. 3 may be provided. Each connection may be used with a different cross-sectional area. The sensor output (in this example a voltage) may then be transmitted along each of a plurality of different conductors, where each conductor connects to phase change material of a respective memory cell, but where each of the conductors has a different cross-sectional area in contact with the phase change material of the respective memory cells. For example, in the arrangement shown in FIG. 1, the first conductor 141 may be connected to the third conductor 143, via the first memory cell 151, in the manner shown in FIG. 3, and the second conductor 142 may be connected to the fourth conductor 144, via the second memory cell 152, in the manner shown in FIG. 3. The first and second phase change materials may be the same (e.g. they may be formed of the same material, such as the same piece of material), but for each memory cell, a different cross-sectional area of phase change material will be in contact with its respective conductor providing the incoming voltage from the sensor 130.

Alternatively, and/or additionally, to facilitate tuning of a memory cell to a selected threshold, one or more heating or cooling elements may be provided to control the temperature of the phase change material. For example, one or more conductive wires may be included which pass close enough to a respective memory cell that a current applied through the wire may induce a heating effect of phase change material of the memory cell. The circuitry may be arranged so that the first to fourth memory cells are each maintained at a different temperature, thereby varying the phase change threshold voltage for these memory cells. As another example, different types or blends of phase change materials may be used to provide different phase change threshold voltages. It will be appreciated in the context of the present disclosure that the specific arrangement of the phase change materials should not be considered limiting. One or more properties of the phase change materials themselves, or their arrangement, may be selected to enable measurement values to be written to the memory circuitry 150 in dependence on the phase of the phase change material.

The different phase change threshold voltages, and the number of memory cells provided, may be selected based on the type of sensor and/or a desired accuracy level/expected range for sensor measurements. For example, the data stored in the memory circuitry 150 may provide an indication of a range between two threshold phase change voltages (with the lower end of the range defined by the highest phase change threshold voltage of a memory cell in the memory circuitry 150 whose phase has changed, and the upper end of the range defined by the lowest phase change threshold voltage of a memory cell in the memory circuitry 150 whose phase has not changed). The value for each of these phase change threshold voltages may be selected to provide a desired amount of granularity (e.g. resolution) to any measurement values to be stored in the memory circuitry 150. The number of memory cells provided may be selected to provide a desired range over which measurement values may be obtained and stored.

A combination of the number of memory cells and the difference between their respective phase change threshold voltages may be selected based on the intended purpose for the sensor. For example, the different threshold voltages may be separated more finely in a measurement range in which the majority of measurement values are expected and/or the different threshold voltages may be separated more coarsely in a measurement range in which measurement values are less likely to occur. The selection of phase change threshold voltages may correspond to a numerical series, such as a geometric series.

Set/Reset Phase Transitions

Suitable phase change materials may comprise materials with reversible amorphous-crystalline phase changes. The materials may exhibit two types of phase transition. The first transition ('set' process) occurs when the material is in its amorphous phase, and a set threshold signal (voltage) is applied to the phase change material. Once the threshold voltage is applied, the material may transition into the crystalline phase, which is electrically conductive. This phase change is what has been described in detail above. For example, this set phase and its corresponding set threshold voltage, has also been referred to herein as a 'phase change threshold voltage' (e.g. the threshold voltage at which the material changes into its electrically conductive phase).

Such phase transitions are typically induced by a pulse signal of defined amplitude, width and shape. Apparatuses disclosed herein may be arranged to control the properties of pulses applied to the memory cells. For example, resistors may be used to reduce voltage or current of pulses applied to the memory cells. As another example, pulse shape and/or amplitude may be controlled (e.g. varied) using additional components, such as a capacitor. Such a capacitor may be arranged so that it is charged with the input signal. The capacitor may then be discharged to one or more of the memory cells. It is to be appreciated in the context of the present disclosure that pulse characteristics may be controlled by using appropriate values of stored charge, capacitance, voltage, resistance, etc. These values may be selected depending on the specific arrangement of memory cells and phase change materials. In some examples, memory cells may be used which have multiple layers of phase change material. In these examples, properties of the circuit such as capacitance etc. may be selected to ensure delivery of an appropriate pulse which could be transmitted through multiple layers of the memory cell.

The phase change material also exhibits a second phase transition. This second transition ('reset' process) occurs when the material is in its crystalline (electrically conductive) phase, and involves the material transitioning back into its amorphous (electrically non-conducting) phase. This reset process occurs, for some phase change materials, when a current at or above a threshold current is applied to the phase change material. For some phase change materials, this reset process occurs when a voltage at or above a threshold voltage is applied to the phase change material. Sensor apparatuses disclosed herein may be configured to apply a 'reset' signal to phase change materials to reset the phase change materials back into their amorphous (electrically non-conducting) state. Applying a reset signal may comprise applying a short pulse at a high current/voltage to the phase change material. The pulse may be applied to each phase change material using its input conductor (for receiving a voltage from the sensor 130). Although, it is to be appreciated in the context of the present disclosure, that a reset need not be applied, and instead, the memory circuitry 150 may provide an indication of the highest sensor voltage obtained (e.g. over many measurements, or during a single use).

Sensor apparatuses disclosed herein may comprise circuitry operable to apply a reset pulse to each phase change material. Any suitable circuitry configured to apply such a reset pulse may be provided. The reset pulse circuitry may be configured to apply a reset pulse prior to any subsequent sensor measurement. The phase change materials remain in the phase they were in for the previous sensor measurement until the reset pulse is delivered, and so until that reset pulse is delivered, the state of the phase change materials indicates the previous measurement value. In this arrangement, a write once read many ('WORM') sensor apparatus may be provided in which the previous measurement value may be obtained from the memory cells in the memory circuitry 150. That is, the previous measurement value may be obtained based on the phase of phase change material in the memory circuitry 150. The sensor apparatus may be configured to remain in this configuration until the next measurement is to be taken. The sensor apparatus may comprise a controller configured to control application of reset pulses to the phase change materials. For example, in the event that it is determined that a measurement is to be obtained using the sensor 130, the controller may control the circuitry to apply a reset pulse, and/or the controller may control the circuitry to apply the reset pulse after a selected time period has elapsed. In other examples, once a measurement is about to be obtained using the sensor 130, such as when the sensor apparatus is receiving power harvested from the radiofrequency transceiver, a reset current may be first applied before obtaining sensor measurements.

Antenna Circuitry

The sensor apparatus may be provided in combination with antenna circuitry. One example of this is illustrated in FIG. 1, which shows an antenna and power conversion circuitry. The antenna may be configured to harvest energy from an applied electromagnetic field. For example, the antenna may be configured to harvest energy from an RF field. This energy may be provided to one or more of the sensor 130, and circuitry for applying a reset pulse to phase change material of the memory cells.

Additionally, or alternatively, the antenna circuitry may be configured to transmit stored data from the memory circuitry 150. The antenna may be connected to the memory circuitry 150 to facilitate retrieval and transmission of data stored in the memory circuitry 150. The antenna circuitry may enable the sensor apparatus to be charged using the RF field and to transmit data from the antenna in response to being charged. Likewise, the antenna circuitry may enable the sensor apparatus to be charged using the RF field and to obtain a sensor measurement using the sensor 130.

The antenna circuitry may also store identifier data to enable data transmitted using the antenna to provide an indication of an identifier for the sensor 130 (e.g. to enable a reader to determine what data is being transmitted). For example, RFID technology may be used.

Sensor apparatuses disclosed herein may be configured to use an antenna to harvest all the power needed for the circuit (e.g. so that the sensor apparatus may avoid the need for any power storage means such as a battery). In other examples, sensor apparatuses may include a power store such as a battery. The battery may provide power to the sensor 130 and/or any reset voltage circuitry. The battery may be used to supplement the power output from the sensor 130, e.g. to scale or buffer the output from the sensor 130.

Use of Resistors to Control Voltage Applied to Phase Change Materials

In examples described above, a voltage output from the sensor 130 is applied to each of a plurality of different memory cells, where the memory cells may have different phase change threshold voltages. Depending on which/how many of the memory cells have changed phase, an indication of the voltage output from the sensor 130 is written to the memory circuitry 150.

Figure 4:
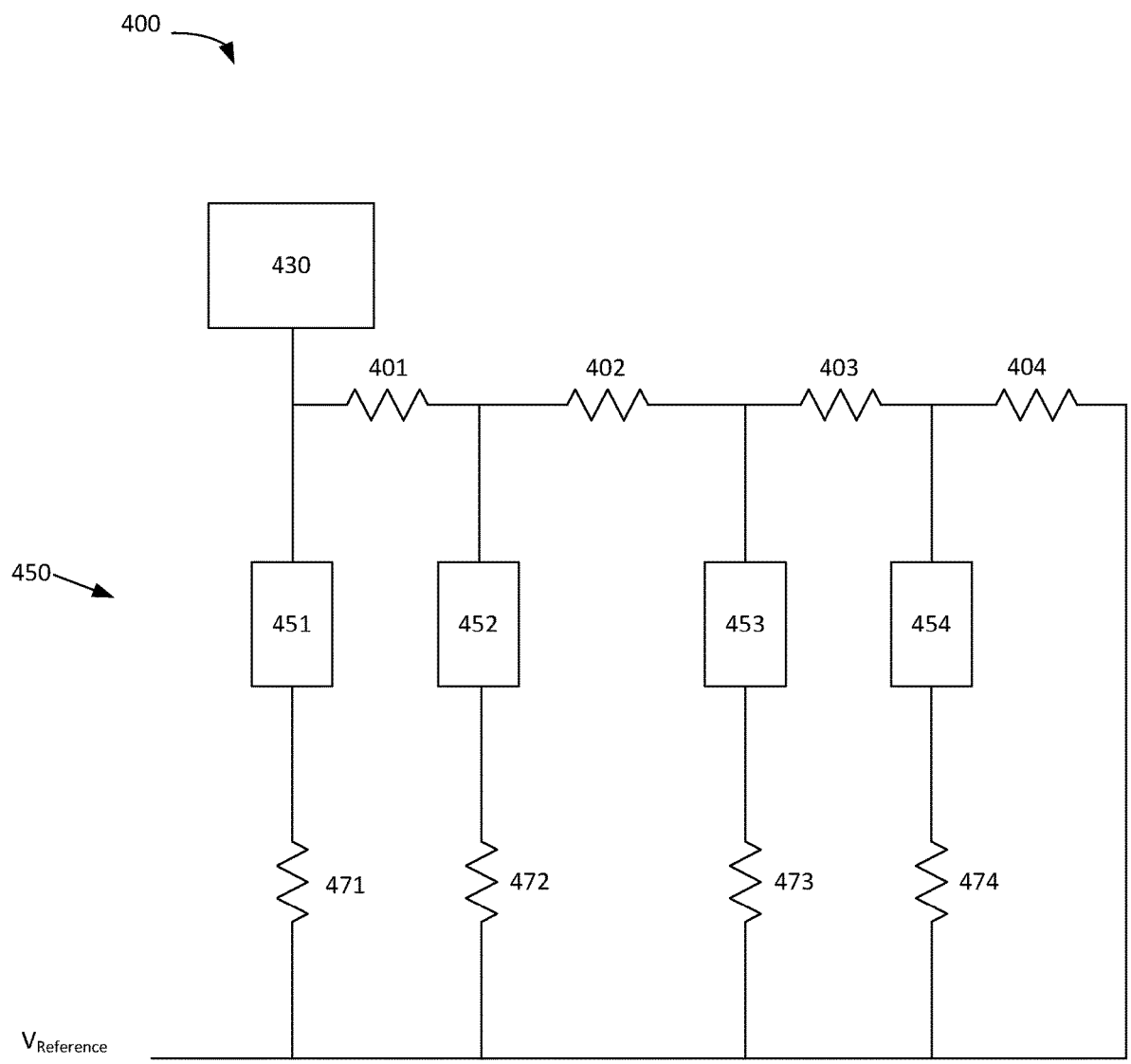
FIG. 4 is a simplified block schematic of a sensor apparatus.

FIG. 4 shows an example of a sensor apparatus 400 in which resistors are included to modify a sensor output applied to phase change material of the memory cells. The resistors are included to control the voltage applied to the phase change material of the memory cells.

Sensor apparatus 400 includes sensor circuitry including a sensor 430, Sensor apparatus 400 also includes first, second, third and fourth current limiting resistors 471, 472, 473 and 474, and memory circuitry 450. The memory circuitry includes first, second, third and fourth memory cells 451, 452, 453, 454, each formed of phase change material. Many of these components may be the same as described above, and so shall not be described in detail again here. The sensor apparatus 400 also includes first, second, third and fourth resistors 401, 402, 403 and 404, which combine to divide the voltage output from the sensor 430 in proportion to the resistances of resistors 401, 402, 403 and 404.

The sensor apparatus 400 is configured to provide a direct write for a measurement value into non-volatile memory in the memory circuitry 450.

The sensor 430 is connected to each of the four memory cells. The sensor 430 is connected to each of the four memory cells by a respective conductive path. In this example, each of the four conductive paths has a different potential difference from the reference voltage applied to it.

The sensor 430 is connected to the first phase change material of the first memory cell 451 via a first path. The first path has a first resistance (which in this example will be low, as there is no resistor in the first path). Therefore, substantially the full amplitude of the voltage output from sensor 430 may be applied across the phase change material of the first memory cell 451. The sensor 430 is connected to the second phase change material of the second memory cell 452 via a second path. The second path includes a voltage drop from the output from sensor 430 across resistor 401, reducing the amplitude of the voltage applied across the phase change material of the second memory cell 452. The sensor 430 is connected to the phase change materials of the third and fourth memory cells by third and fourth conductive paths respectively. The third and fourth conductive paths have third and fourth resistances respectively, with the third conductive path including both the first and second resistor 401, 402, and the fourth conductive path including the first, second and third resistors 401, 402, 403. The four conductive paths therefore have different resistances, and the phase change materials of the four memory cells 451, 452, 453 and 454 experience different fractions of the voltage output from sensor 430 across them. Resistor 404 provides a potential difference from the reference voltage for the fourth conductive path through the fourth memory cell 454.

The memory cells may all have the same phase change threshold voltage, e.g. they may be the same size/shape/temperature/material, or they may have different threshold voltages. However, it is to be appreciated in the context of the present disclosure that the inclusion of the different divider resistances may enable greater freedom for the selection of the memory cells (e.g. for their threshold voltages). Whether or not a memory cell will change phase will depend on the sensor output value and the fraction of the voltage output of the sensor set by the combination of divider resistors and applied to the respective conductive path to that memory cell.

As each of the conductive paths has a different voltage division point, for the phase change material of each memory cell there will be a different voltage drop between the voltage output from the sensor 430 and the voltage applied to that phase change material. As such, the voltage applied to each memory cell's phase change material will be different. In this example, the voltage applied to the phase change material of each subsequent memory cell will decrease. The arrangement of the phase change materials may be similar to that described above, in that the phase change materials will either be in an electrically conducting phase or an electrically non-conducting phase. As the different conductive paths will provide different voltage drops, the voltage applied to the phase change materials of subsequent memory cells will be less than that applied to the phase change material of the preceding memory cell (e.g. the voltage applied to the fourth will be less than that applied to the first).

The memory cell which changes phase and which is associated with the highest voltage drop will provide an indication of the sensor output voltage. That is, the sensor output voltage may be determined to be at least a voltage greater than the combination of the relevant voltage drop and the phase change threshold voltage for that phase change material. As with the examples described above, the sensor output voltage may be determined to be in a range between the highest voltage associated with a phase change material which has changed phase and the lowest voltage associated with a phase change material which has not changed phase.

In the example shown in FIG. 4, the first memory cell 451 is not associated with a corresponding resistor, but this arrangement should not be considered limiting. For example, the first conductive path may include a first resistor. Likewise, although each of the resistors are arranged in series so that each subsequent conductive path includes all of the preceding resistors, this arrangement should not be considered limiting. Instead, each resistor may be arranged in series preceding its phase change material so that each conductive path only includes one resistor. Instead, resistors may be included in an arrangement by which they may be used to modify the sensor output provided to the phase change material of one or more of the memory cells.

Use of Phase Change Threshold Currents

In examples described herein, a voltage output from the sensor may be applied to a plurality of different memory cells, where the memory cells have different phase change threshold voltages. In examples described herein, a voltage output from the sensor may be applied to a plurality of different memory cells, where that voltage is applied across a different amount of resistance depending on the memory cell to which that voltage is applied. These examples may be combined (e.g. to include variable resistance and variable threshold voltages). As disclosed herein, depending on which/how many of the memory cells have changed phase, an indication of the voltage output from the sensor may be obtained, e.g. as per the phase of the memory cells in the memory circuitry.

Figure 5:
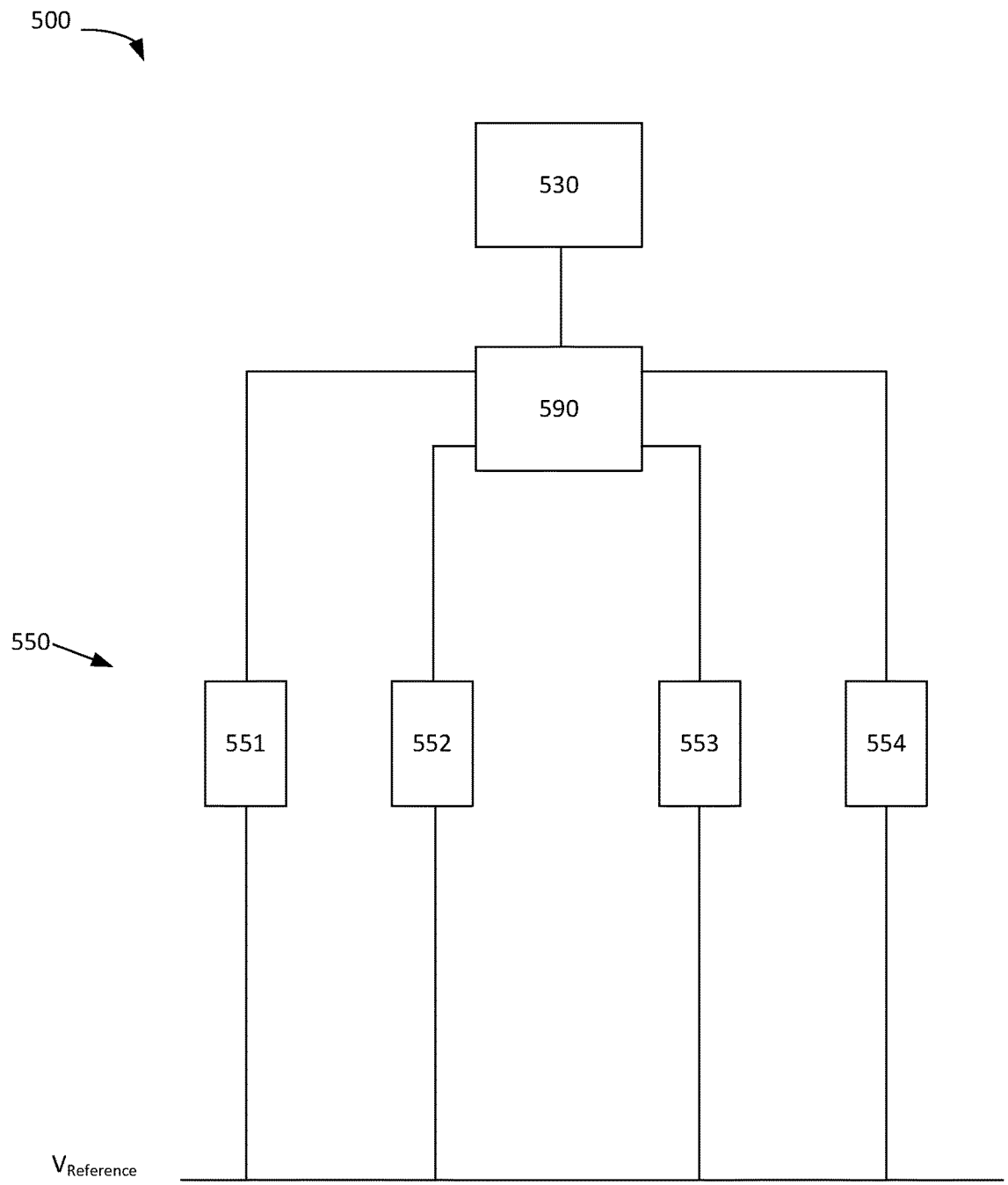
FIG. 5 is a simplified block schematic of a sensor apparatus.

FIG. 5 shows an example of sensor apparatus 500 in which a selected current is applied to phase change material of memory cells. The sensor apparatus 500 includes sensor circuitry which includes a sensor 530 and a current switch 590. The apparatus 500 also includes memory circuitry 500 comprising first, second, third and fourth memory cells 551, 552, 553, 554 formed of phase change material.

The sensor apparatus 500 is configured to provide a direct write for measurement values into non-volatile memory in the memory circuitry 550.

The sensor 530 is connected to the current switch 590, and the current switch 590 is connected to each of the memory cells in the memory circuitry 550.

The sensor 530 is configured to provide an output current indicative of the measurement value to the current switch 590. The current switch 590 may be configured to receive this output current indicative of the measurement value and to provide a sensor output representative of this output current. The current switch 590 is configured to process and apply an identical current waveform to the phase change material of each of the memory cells. For example, the current switch 590 may comprise a time multiplex switch, and/or a current mirror may be used. The current switch 590 is configured to first apply a current to the phase change material of the first memory cell for a selected time period. The current switch 590 then applies that current to the phase change material of the second memory cell for the selected time period (and the same for the third and fourth memory cells).

In a similar manner to examples described above, depending on the current output applied to the phase change material of the memory cells, phase change material will either change phase, or not. A measurement value may then be stored in the memory circuitry based on the phase of the phase change material of the different memory cells.

In examples described herein, a 'set' process is used in which the phase change material changes from an amorphous phase (high electrical resistance) to a crystalline phase (low electrical resistance). When a voltage is applied at or above the threshold voltage, this phase change occurs. This changed phase may be stored in the memory circuitry to enable the measurement value to be determined therefrom.

When applying current to the phase change materials, the 'reset' process may be used. In this case, the relevant phase change is that from crystalline (low electrical resistance) to amorphous (high electrical resistance). In response to a current being applied to phase change material of a memory cell above a phase change threshold current, the phase change material may change phase to its electrically non-conducting phase ('second' or 'amorphous' phase), which inhibits transmission of current therethrough. Each of the memory cells used may have an associated (and different) phase change current threshold. The sensor apparatus 500 is arranged so that an indication of the current output from the sensor 530 may be determined based on the phase of the relevant memory cells in the memory circuitry 550. In this case, the phase of the phase change material of the memory cells in the memory circuitry 550 still provides an indication of the measurement value, only the phase of these materials provides the opposite information to that of the examples described above. Here, where phase change material of a memory cell is in the electrically non-conductive phase, this indicates that the current applied thereto was above the phase change current threshold. Likewise, where phase change material of a memory cell is in the electrically conductive phase, this indicates that the current applied thereto was below the phase change current threshold.

Determining the measurement value may be performed in an analogous manner to that described above when using voltages.

Alternatively, a sensor apparatus similar to that in FIG. 2 may be configured to provide a direct write for measurement current values into non-volatile memory in the memory circuitry 150. A sensor output current from sensor 130 may be applied to the phase change materials in memory cells 151, 152, 153 and 154 in parallel. If the phase change materials in those memory cells are all initially in the conducting (crystalline) state, then the sensor output current is divided equally between the parallel paths to the reference voltage rail (or plane), since each path through a memory cell has the same low resistance. In this example, the current through each memory cell is one quarter of the sensor output current. By configuring the threshold (e.g. Reset) currents of the phase change materials in the four memory cells to cover a range of appropriate values, the sensor output current may be measured as follows. The threshold current of the phase change material in one of the memory cells, for example 151, may be set to a first value that is lower than those of the other three memory cells. If the current through memory cell 151, i.e. one quarter of the sensor output current, is less than the current threshold of the phase change material in memory cell 151, none of the phase change materials in the memory cells changes phase. However if the current through memory cell 151 is greater than the current threshold of the phase change material in memory cell 151, its phase is changed to the non-conducting (amorphous) state. This increases the current through each of the other memory cells, to become one third of the sensor output current. The threshold current of the phase change material in another one of the memory cells, for example 152, may be set to a second value that is higher than the first value but lower than those of the other two memory cells (153 and 154). If the current through memory cell 152, i.e. one third of the sensor output current, is less than the current threshold of the phase change material in memory cell 152, none of the phase change materials in memory cells 152, 153 or 154 changes phase. However if the current through memory cell 152 is greater than the current threshold of the phase change material in memory cell 152, its phase is changed to the non-conducting (amorphous) state. This increases the current through each of the other two memory cells, to become one half of the sensor output current. The same principles may be applied to the threshold currents of the phase change materials in memory cells 153 and 154, allowing the output current of the sensor (130) to directly write to the memory circuitry 150. As described above in relation to the provision of different phase change threshold voltages, to provide different phase change threshold currents different phase change materials may be used and/or a different arrangement of the phase change materials may be provided. The memory cells may be arranged to provide this different arrangement of phase change materials. For a given phase change material, its threshold current may be tailored to a specific value by varying one or more parameters of that phase change material. These parameters may include geometric properties of the phase change material and/or properties of the phase change material's environment. Further control over the amount of current passing through the phase change material of each memory cell may be exerted by selection of the resistances of optional current limiting resistors 171, 172, 173 and 174. By selecting the number of memory cells in memory circuit 150, by controlling the threshold current for the phase change material in each memory cell, and by selecting appropriate current limiting resistors, any desired range and resolution of sensor output current measurement may be provided.

Variants, Alternatives and Additional Features

Some examples described herein include use of a sensor. However, it is to be appreciated in the context of the present disclosure that a sensor need not be provided. Embodiments may provide signal measuring apparatuses for receiving an input signal and storing indication representing this signal in memory circuitry. The input signal may come from a sensor, or it may come from other components (e.g. it may measure electrostatic discharge or properties of a circuit). Apparatuses of the present disclosure may be configured for connection to a sensor, e.g. they may be connectable to a sensor, such as a sensor external to the signal measuring apparatus.

Examples described herein may further include use of current to voltage and/or voltage to current converters. For example, where the sensor is configured to provide a current output, and the signal to be applied to the phase change materials is to be provided in the form of a voltage, a current to voltage converter may be provided, such as a resistor, or any suitable component. Likewise, where the sensor is configured to provide a voltage output, and the signal to be applied to the phase change materials is to be provided in the form of a current, a voltage to current converter may be provided, such as a resistor, or any suitable component. In some examples, reference voltages may be used in addition to the circuitry described above. For example, a reference voltage may be applied downstream of the phase change materials.

Examples described herein include current limiting resistors connected in series with phase change materials, so that each phase change material is connected in series to a corresponding current limiting resistor. However, this arrangement is not to be considered limiting. A current limiting resistor may be provided in series with the whole phase change material array. The one or more current limiting resistors may be connected on the input side of the memory cells, and/or on the output side of the memory cells. In other examples, current limiting resistors may not be provided. Current-sense resistors may be provided in a similar manner to the current limiting resistors. For example, the circuitry may be arranged to inhibit distortions arising from one or more of the phase change materials changing phase (e.g. and altering the impedance of the array), and/or additional components may be used to this effect. For example, the impedance of components may be selected accordingly, such as the output impedance from the sensors.

Examples described herein include use of phase change materials. However, it is to be appreciated in the context of the present disclosure that the material of each memory cell may comprise any suitable material which may exhibit a tangible change of material state in response to a current or voltage being applied thereto having a magnitude at or above a desired value. The selected material may have one or more properties which may be selected to enable tuning to the desired value. Example materials may include phase change materials, thin-film memory and/or RRAM.

The number of phase change materials or memory cells used has been described as two or four in the examples. However, it is to be appreciated that this is not limiting. One, or two or more phase change materials or memory cells may be provided. The arrangement of phase change materials, memory cells, and their relevant thresholds, may be selected accordingly. For example, depending on the type or application of the sensor, the arrangement may be selected accordingly, such as to provide a suitable number of memory cells incorporating phase change materials and a suitable resolution between the different measurement values associated with a change of phase. It will be appreciated that only memory cell may be provided. This may still store information, as it will provide an indication of whether a voltage or current having a magnitude at or above a threshold value has been received. For example, this may find utility when detecting whether an electrostatic discharge has occurred, or to identify if a measurement value (e.g. sensor output) ever exceeded a threshold value.

In examples described above, variations in voltage, current and/or resistance within the circuitry may be used to enable data to be written to the memory circuitry which is indicative of measurement values from the sensor. It is to be appreciated in the context of the present disclosure that the different arrangements may be combined. For example, both voltage and resistance of the circuitry may be controlled. In such examples, different phase change materials or memory cells in the circuitry may have the same or different phase change threshold voltages. Likewise, conductive paths between the sensor and the phase change materials may have different or the same resistances. Where two phase change materials or memory cells have the same phase change threshold voltage, they may be connected to the sensor by a conductive path having a different resistance, or they may be connected to a resistor ladder having different voltage taps. Where two phase change materials are connected to the sensor by a conductive path having the same resistance, they may have different phase change threshold voltages. In some examples, two phase change materials may be provided which are expected to change phase at the same time. This may facilitate increased reliability in measurements indicating change of phase. Varying resistance and voltage may be combined to fine tune the phase change values for different phase change materials (e.g. to fine tune resolution of data stored in the memory circuitry). Similar arrangements may be provided which use current-limiting resistors to vary a current applied to a phase change material.

It is to be appreciated in the context of the present disclosure that reference to application of voltage or current refers to a magnitude of the voltage or current. Therefore, reference to a current or voltage at or above a selected value encompasses both a positive value greater than the selected positive value and a negative value less than the selected negative value.

As described above, apparatuses of the present disclosure are arranged to enable measurement values to be stored in the memory circuitry based on the phase change materials in the memory circuitry which have changed phase. In examples, this may enable a range for the measurement values to be determined based on the highest threshold voltage or threshold current associated with a phase change material to change phase, and the lowest threshold voltage or threshold current associated with phase change material not to change phase. The circuitry may be arranged so that the relevant measurement values for phase change materials conform to a particular numerical series. For example, a geometric series may be defined where $V_n$ is proportional to $2^n$ (where n represents the phase change material number in the series of phase change materials). In other examples, a high resolution may be defined by providing the threshold measurement values in close proximity to one another, such as with the values increasing linearly. In some examples, the output from the sensor may provide more than just a single voltage/current indicative of its measurement value. For example, a series of pulses (currents/voltages) may be applied. The data stored in the memory circuitry may represent the maximum voltage recorded in such examples.

In some examples, multiple layers of phase change material may be provided. In such examples, an incoming current/voltage (the measurement signal) is applied to the first layer of phase change material. Depending on the state of that layer, a signal may be transmitted to a subsequent layer. For example, the first layer may be in an electrically non-conducting state. If the measurement signal is of sufficient magnitude, the first layer may be switched into its electrically conducting state. A signal may therefore be transmitted to the second layer, which may in turn switch depending on the magnitude of the transmitted signal. Therefore, based on the furthest layer which has switched phase, a magnitude of the measurement signal may be identified. In some examples, multiple phase change materials, or arrangements of phase change materials may be used to facilitate calibration of measurement values. For example, in the event that additional variables may influence a value for the threshold voltage/current, calibration means may be included to facilitate calibration to allow for this. For example, an additional memory cell at a reference value may be included which provides a calibration material and/or area.

It is to be appreciated in the context of the present disclosure that signal measuring apparatuses as described herein may be used to enable a number of different types of input signals to be measured and stored. As described above, information stored may indicate that a signal was received at or above a threshold value. In examples with multiple memory cells, information stored may represent that a signal within a certain range of values was received. This technology for storing information representative of a received signal may find application in any of a number of different applications.

For example, embodiments may find use in the field of logistics, where an apparatus may be associated with (e.g. affixed to) an article in transit. The apparatus may be suitably interrogated to identify whether or not an event has occurred which brought about a signal above a threshold being recorded. For example, the material state of the memory cell(s) of the apparatus may indicate whether or not a parameter associated with the article (such as electric field/temperature/humidity etc.) has exceeded a threshold (e.g. the apparatus may be connected to a sensor having an output which indicates a value for this parameter). Embodiments may find similar utility in other fields for monitoring products such as monitoring of pharmaceuticals, consumer products (such as fast-moving consumer goods), food and beverages, cosmetics, chemicals, documents in transit (e.g. postal products), toys, games and sporting goods.

As another example, embodiments may find utility in healthcare products and/or wearable technology. Again, similar principles apply, where embodiments may enable a stored indication of whether or not a signal above a threshold value has been registered. This may be used in clothing or apparel to indicate whether a wearer of the product has been subject to one or more certain conditions such as excessive temperatures, electric fields etc. Embodiments may be utilised in medical applications where they are connected to a sensor and record an indication of sensor outputs. For example, a signal measuring apparatus may be connected to a body function monitoring sensor and configured to monitor the output from that sensor, such as being connected to receive an indication of an electrocardiogram (ECG). In the event that the ECG reads above a threshold value, this can be stored in the memory circuitry. Embodiments of the present disclosure may enable smaller volume memory storage so that apparatuses described herein may be used in implants into an animal or human body, such as to record information recorded from an implanted sensor.

In other examples, embodiments may be used in substance detection. In such examples a field effect transistor (FET) may be used to identify the presence of a substance of interest, such as a virus or other biological indicator. In the event that the substance of interest is present in a gate region of the FET, the FET may conduct between source and drain so that an output current is registered (from source or drain). Embodiments may be connected to receive this input signal and to store an indication of it.

It will be appreciated from the discussion above that the examples shown in the figures are merely exemplary, and include features which may be generalised, removed or replaced as described herein and as set out in the claims. With reference to the drawings in general, it will be appreciated that schematic functional block diagrams are used to indicate functionality of systems and apparatus described herein. In addition the processing functionality may also be provided by devices which are supported by an electronic device. It will be appreciated however that the functionality need not be divided in this way, and should not be taken to imply any particular structure of hardware other than that described and claimed below. The function of one or more of the elements shown in the drawings may be further subdivided, and/or distributed throughout apparatus of the disclosure. In some embodiments the function of one or more elements shown in the drawings may be integrated into a single functional unit.

As will be appreciated by the skilled reader in the context of the present disclosure, each of the examples described herein may be implemented in a variety of different ways. Any feature of any aspects of the disclosure may be combined with any of the other aspects of the disclosure. For example method aspects may be combined with apparatus aspects, and features described with reference to the operation of particular elements of apparatus may be provided in methods which do not use those particular types of apparatus. In addition, each of the features of each of the embodiments is intended to be separable from the features which it is described in combination with, unless it is expressly stated that some other feature is essential to its operation. Each of these separable features may of course be combined with any of the other features of the embodiment in which it is described, or with any of the other features or combination of features of any of the other embodiments described herein. Furthermore, equivalents and modifications not described above may also be employed without departing from the invention.

Certain features of the methods described herein may be implemented in hardware, and one or more functions of the apparatus may be implemented in method steps. It will also be appreciated in the context of the present disclosure that the methods described herein need not be performed in the order in which they are described, nor necessarily in the order in which they are depicted in the drawings. Accordingly, aspects of the disclosure which are described with reference to products or apparatus are also intended to be implemented as methods and vice versa. The methods described herein may be implemented using one or more controllers, such as computer programs or hardware, or any combination thereof. Computer programs include software, middleware, firmware, and any combination thereof. Such programs may be provided as signals or network messages and may be recorded on computer readable media such as tangible computer readable media which may store the computer programs in non-transitory form. Hardware includes computers, handheld devices, programmable processors, general purpose processors, application specific integrated circuits (ASICs), field programmable gate arrays (FPGAs), and arrays of logic gates. In some examples, one or more memory elements can store data and/or program instructions used to implement the operations described herein. Embodiments of the disclosure provide tangible, non-transitory storage media comprising program instructions operable to program a processor to perform any one or more of the methods described and/or claimed herein and/or to provide data processing apparatus as described and/or claimed herein.

Other examples and variations of the disclosure will be apparent to the skilled addressee in the context of the present disclosure.

The invention claimed is:

1. A signal measuring apparatus comprising:
electrical signal receiving circuitry configured to electrically connect to a sensor to receive an input signal from said sensor, wherein the input signal is indicative of at least one measurement value to be measured by the signal measuring apparatus; and
memory circuitry coupled to the electrical signal receiving circuitry and configured to store information representing a magnitude of a voltage or a current of the input signal;
wherein the memory circuitry comprises a first memory cell having a material which is arranged to switch from a first material state to a second material state in response to a first switching signal being applied thereto, wherein the first memory cell is tuned to a first value for the first switching signal so that a current or voltage with a magnitude at or above the first value will cause the material of the first memory cell to switch from the first material state to the second material state;
wherein the signal measuring apparatus is configured to apply a measurement signal indicative of the input signal to the first memory cell for switching the material of the first memory cell from the first material state to the second material state in dependence on a magnitude of the voltage or current of the measurement signal;
wherein the memory circuitry comprises a second memory cell having a material which is arranged to switch from a first material state to a second material state in response to a second switching signal being applied thereto, wherein the second memory cell is tuned to a second value for the second switching signal so that a current or voltage with a magnitude at or above the second value will cause the material of the second memory cell to switch from the first material state to the second material state;
wherein the signal measuring apparatus is configured to apply the measurement signal to the second memory cell for switching the material of the second memory cell from the first material state to the second material state in dependence on a magnitude of the voltage or current of the measurement signal; and
wherein the signal measuring apparatus comprises a layer of electrically insulating material which defines: (i) a first window through which the measurement signal is applied to the material of the first memory cell, and (ii) a second window through which the measurement signal is applied to the material of the second memory cell.

2. The signal measuring apparatus of claim 1, wherein the signal measuring apparatus comprises the sensor, wherein the sensor is configured to obtain at least one measurement value; and wherein the input signal comprises a sensor signal having a voltage or current indicative of the measurement value.

3. The signal measuring apparatus of claim 1, wherein a dimension of the material of the first memory cell is selected to tune the first memory cell to the first value.

4. The signal measuring apparatus of claim 3, wherein a cross-sectional area of the material of the first memory cell to which the measurement signal is applied is selected to tune the first memory cell to the first value.

5. The signal measuring apparatus of claim 1, wherein the signal measuring apparatus comprises a layer of electrically insulating material which defines a first window through which the measurement signal is applied to the material of the first memory cell.

6. The signal measuring apparatus of claim 5, wherein a dimension of the first window is selected to tune the first memory cell to the first value.

7. The signal measuring apparatus of claim 1, wherein a dimension of the first window is different to a dimension of the second window.

8. The signal measuring apparatus of claim 1, wherein the material of the first memory cell comprises a phase change material having an electrically conductive state and an electrically non-conductive state.

9. The signal measuring apparatus of claim 8, wherein the first material state of the phase change material of the first memory cell is the electrically non-conductive state, and wherein the second material state of the phase change material of the first memory cell is the electrically conductive state; and wherein the first memory cell is arranged to switch from the electrically non-conductive state to the electrically conductive state in response to a voltage with a magnitude greater than the first value being applied thereto.

10. The signal measuring apparatus of claim 1, wherein the signal measuring apparatus is configured to apply a reverse switching signal to the first memory cell, wherein an amplitude and/or duration of the reverse switching signal is selected to switch the material of the first memory cell from the second material state to the first material state.

11. The signal measuring apparatus of claim 1, further comprising a radio frequency transceiver and power harvesting circuitry for harvesting power received from the radio frequency transceiver.

12. The signal measuring apparatus of claim 11, wherein the signal measuring apparatus is configured to transmit an indication of said information representing a magnitude of a voltage or current of the input signal stored in the memory circuitry using the radio frequency transceiver.

13. The signal measuring apparatus of claim 1, wherein the signal measuring apparatus is configured to modify the input signal to provide the measurement signal to be applied to the first memory cell.

14. The signal measuring apparatus of claim 13, wherein the signal measuring apparatus comprises a first resistor arranged to modify the input signal to provide the measurement signal to be applied to the first memory cell.

15. A signal measuring apparatus comprising:

electrical signal receiving circuitry configured to electrically connect to a sensor to receive an input signal from said sensor, wherein the input signal is indicative of at least one measurement value to be measured by the signal measuring apparatus; and memory circuitry coupled to the electrical signal receiving circuitry and configured to store information representing a magnitude of a voltage or a current of the input signal;

wherein the memory circuitry comprises a first memory cell having a material which is arranged to switch from a first material state to a second material state in response to a first switching signal being applied thereto, wherein the first memory cell is tuned to a first value for the first switching signal so that a current or voltage with a magnitude at or above the first value will cause the material of the first memory cell to switch from the first material state to the second material state;

wherein the signal measuring apparatus is configured to apply a measurement signal indicative of the input signal to the first memory cell for switching the material of the first memory cell from the first material state to the second material state in dependence on a magnitude of the voltage or current of the measurement signal;

wherein the material of the first memory cell comprises a phase change material having an electrically conductive state and an electrically non-conductive state;

wherein the first material state of the phase change material of the first memory cell is the electrically conductive state, and wherein the second material state of the phase change material of the first memory cell is the electrically non-conductive state; and wherein the first memory cell is arranged to switch from the electrically conductive state to the electrically non-conductive state in response to a current or voltage having a magnitude greater than the first value being applied thereto.

16. A signal measuring apparatus comprising:

electrical signal receiving circuitry configured to electrically connect to a sensor to receive an input signal from said sensor, wherein the input signal is indicative of at least one measurement value to be measured by the signal measuring apparatus; and memory circuitry coupled to the electrical signal receiving circuitry and configured to store information representing a magnitude of a voltage or a current of the input signal;

wherein the memory circuitry comprises a first memory cell having a material which is arranged to switch from a first material state to a second material state in response to a first switching signal being applied thereto, wherein the first memory cell is tuned to a first value for the first switching signal so that a current or voltage with a magnitude at or above the first value will cause the material of the first memory cell to switch from the first material state to the second material state;

wherein the signal measuring apparatus is configured to apply a measurement signal indicative of the input signal to the first memory cell for switching the material of the first memory cell from the first material state to the second material state in dependence on a magnitude of the voltage or current of the measurement signal;

wherein the signal measuring apparatus comprises an electrically insulating material having a first window which defines a cross-sectional area of the material of the first memory cell connected to receive the measurement signal; and wherein the first window is arranged to define the cross-sectional area of the material of the first memory cell connected to receive the measurement signal to be an area selected to tune the first memory cell to the first value.

17. The signal measuring apparatus of claim 16, wherein the memory circuitry comprises a second memory cell having a material which is arranged to switch from a first material state to a second material state in response to a second switching signal being applied thereto, wherein the second memory cell is tuned to a second value for the second switching signal so that a current or voltage with a magnitude at or above the second value will cause the material of the second memory cell to switch from the first material state to the second material state; and wherein the signal measuring apparatus is configured to apply the measurement signal to the second memory cell for switching the material of the second memory cell from the first material state to the second material state in dependence on a magnitude of the voltage or current of the measurement signal.

18. The signal measuring apparatus of claim 17, wherein a dimension of the material of the second memory cell is selected to tune the second memory cell to the second value.

19. The signal measuring apparatus of claim 18, wherein a cross-sectional area of the material of the second memory cell to which the measurement signal is applied is selected to tune the second memory cell to the second value.

20. The signal measuring apparatus of claim 17, wherein the second value is different to the first value.

* * * * *